United States Patent
Fink et al.

(10) Patent No.: US 10,461,733 B2
(45) Date of Patent: Oct. 29, 2019

(54) PARALLELING POWER SWITCHES USING A DIFFERENTIAL MODE CHOKE IN THE GATE DRIVE LOOP

(71) Applicant: Power Integrations, Inc., San Jose, CA (US)

(72) Inventors: Karsten Fink, Werl (DE); Christoph Dustert, Soest (DE); Andreas Volke, Soest (DE); Michael Hornkamp, Ense (DE); Martin Ulbrich, Soest (DE)

(73) Assignee: Power Integrations, Inc., San Jose, CA (US)

( * ) Notice: Subject to any disclaimer, the term of this patent is extended or adjusted under 35 U.S.C. 154(b) by 27 days.

(21) Appl. No.: 15/565,398

(22) PCT Filed: Apr. 14, 2016

(86) PCT No.: PCT/EP2016/058247
§ 371 (c)(1),
(2) Date: Oct. 9, 2017

(87) PCT Pub. No.: WO2016/166228
PCT Pub. Date: Oct. 20, 2016

(65) Prior Publication Data
US 2018/0123579 A1    May 3, 2018

Related U.S. Application Data

(60) Provisional application No. 62/147,419, filed on Apr. 14, 2015.

(51) Int. Cl.
*H03K 17/12* (2006.01)
*H02M 1/088* (2006.01)
(Continued)

(52) U.S. Cl.
CPC .......... *H03K 17/122* (2013.01); *H02M 1/088* (2013.01); *H03K 17/127* (2013.01); *H03K 17/145* (2013.01); *H03K 17/168* (2013.01)

(58) Field of Classification Search
CPC .. H03K 17/122; H03K 17/127; H03K 17/145; H03K 17/168; H02M 1/088
(Continued)

(56) References Cited

U.S. PATENT DOCUMENTS

| 7,817,451 | B2 | 10/2010 | Barbosa et al. |
| 8,279,571 | B2 | 10/2012 | Crewson et al. |

(Continued)

FOREIGN PATENT DOCUMENTS

| JP | 2004096829 |   | 3/2004 |
| JP | 2004096829 | A * | 3/2004 |

(Continued)

OTHER PUBLICATIONS

International Application No. PCT/EP2016/058247—Internation Preliminary Report on Patentability dated Oct. 26, 2017, 15 pages.

(Continued)

*Primary Examiner* — Tomi Skibinski
(74) *Attorney, Agent, or Firm* — Brian H. Floyd

(57) ABSTRACT

In one aspect, a device includes a first power switch having a first gate, a second power switch paralleled with the first power switch and having a second gate, a gate driver to output a gate drive signal to drive both the first gate and the second gate, a first conduction path to couple the gate drive signal to the first gate, a second conduction path to couple the gate drive signal to the second gate, and a distribution choke to distribute the gate drive signal to the first and second power switches. The distribution choke has a first winding disposed in the first conduction path and a second (Continued)

winding disposed in the second conduction path. The distribution choke is coupled in a differential mode.

23 Claims, 13 Drawing Sheets

(51) Int. Cl.
*H03K 17/14* (2006.01)
*H03K 17/16* (2006.01)

(58) Field of Classification Search
USPC ........ 327/108–112, 427, 434, 437, 403–405, 327/443; 326/82, 83, 87
See application file for complete search history.

(56) References Cited

U.S. PATENT DOCUMENTS 8,847,656 B1 * 9/2014 A ..................... H03K 17/08122
327/310

2007/0152730 A1 * 7/2007 Wagoner .............. H03K 17/127
327/403
2016/0226480 A1 8/2016 Marquardt

FOREIGN PATENT DOCUMENTS

| JP | 2004098828 | 4/2004 |
|----|------------|--------|
| JP | 2004215416 | 7/2004 |
| JP | 2006149169 | 6/2006 |

OTHER PUBLICATIONS

Russian Patent Application No. 2017137757—Office Action and Search Report with English Translation dated Sep. 11, 2018, 22 pages.
International Application No. PCT/EP2016/058247—International Search Report and Written Opinion dated Jul. 15, 2016, 16 pages.

* cited by examiner

PARALLELING POWER SWITCHES USING A DIFFERENTIAL MODE CHOKE IN THE GATE DRIVE LOOP

REFERENCE TO RELATED APPLICATIONS

This application claims priority to International Patent Application No. PCT/EP2016/058247, filed on Apr. 14, 2016, which claims priority to U.S. Provisional Application No. 62/147,419, filed Apr. 14, 2015. International Patent Application No. PCT/EP2016/058247 and U.S. Provisional Application No. 62/147,419 are hereby incorporated by reference.

BACKGROUND INFORMATION

Field of the Disclosure

The present specification relates to the paralleling of power switches using one or more differential mode chokes to distribute the drive signal.

Background

Power switches are switching devices designed to switch relatively high voltages and currents. Examples of such power switches include insulated gate bipolar transistors (IGBTs), metal-oxide-semiconductor field-effect transistors (MOSFETs), high-electron-mobility transistors (HEMTs), etc. These power switches are commonly made using semiconductor materials such as silicon, silicon carbide, gallium nitride, or other suitable semiconductor materials. Power switches made using semiconductors have device characteristics that are adapted to switching such voltages and currents. However, even when individual power switches have device characteristics that are relatively favorable, individual power switches are often incapable of meeting the demands of some high power applications.

To address such demands, multiple power switches are often assembled into modules. In such modules, parallel power switches may be used in conjunction to switch the voltages and currents demanded by the application.

SUMMARY

In a first aspect, a device includes a first power switch having a first gate, a second power switch paralleled with the first power switch and having a second gate, a gate driver to output a gate drive signal to drive both the first gate and the second gate, a first conduction path to couple the gate drive signal to the first gate, a second conduction path to couple the gate drive signal to the second gate, and a distribution choke to distribute the gate drive signal to the first and second power switches. The distribution choke has a first winding disposed in the first conduction path and a second winding disposed in the second conduction path. The distribution choke is coupled in a differential mode.

In a second aspect, a power module includes a first power switch having a first gate, second power switch paralleled with the first power switch and having a second gate, an integrated gate driver to output a gate drive signal to drive both the first gate and the second gate, a first conduction path to couple the gate drive signal to the first gate, a second conduction path to couple the gate drive signal to the second gate, and a distribution choke to distribute the gate drive signal to the first and second power switches. The distribution choke has a first winding disposed in the first conduction path and a second winding disposed in the second conduction path. The distribution choke is coupled in a differential mode.

In a third aspect, a power module includes a first power switch having a first gate, a second power switch paralleled with the first power switch and having a second gate, a terminal to couple the gate driver output of an external gate driver signal to drive both the first gate and the second gate, a first conduction path to couple the gate drive signal to the first gate, a second conduction path to couple the gate drive signal to the second gate, and a distribution choke to distribute the gate drive signal to the first and second power switches. The distribution choke has a first winding disposed in the first conduction path and a second winding disposed in the second conduction path. The distribution choke is coupled in a differential mode.

In a fourth aspect, a power module includes a first plurality of power switches coupled in parallel and each power switch having a gate, a gate driver to output a gate drive signal to drive each gate, a conduction path to couple the gate drive signal to the gate of each power switch, and a first plurality of distribution chokes to distribute the gate drive signal to each gate. The number of power switches is equal to the number of distribution chokes. Each distribution choke has a first winding and a second winding disposed in a first conduction path and a second conduction path to a gate. Each distribution choke is coupled in a differential mode. The gate drive signal is distributed in a plurality of conduction paths and to a second plurality of distribution chokes. The number of distribution chokes in the second plurality is less than the number of distribution chokes in the first plurality by one.

In a fifth aspect, a device includes a first IGBT having a first gate, a second IGBT paralleled with the first IGBT and having a second gate, an IGBT driver to output a gate drive signal to drive both the first gate and the second gate, a first conduction path to couple the gate drive signal to the first gate, a second conduction path to couple the gate drive signal to the second gate, and a distribution choke to distribute the gate drive signal to the first and second IGBTs. The distribution choke has a first winding disposed in the first conduction path and a second winding disposed in the second conduction path. The distribution choke is coupled in a differential mode.

In a sixth aspect, a power switch module includes a first voltage-controlled power switch having a gate and a pair of main terminals, a second voltage-controlled power switch having a gate and a pair of main terminals, wherein one of the main terminals of each of the first and second voltage-controlled power switch are coupled together, a differential choke comprising a first winding and a second winding, and a power switch driver comprising a gate drive signal output coupled by a first conduction path to the gate of the first voltage-controlled power switch and by a second conduction path to the gate of the second voltage-controlled power switch. The first conduction path comprises the first winding. The second conduction path comprises the second winding. A difference in impedance of the first conduction path between the gate drive signal output and the first winding and impedance of the second conduction path between the gate drive signal output and the second winding is smaller than a difference in impedance of the first conduction path between the first winding and the gate of the first voltage-controlled power switch and impedance of the second conduction path between the second winding and the gate of the second voltage-controlled power switch.

In a seventh aspect, a power switch module includes three or more paralleled power switches each having a respective control terminal, a common power switch driver comprising a single gate drive signal output coupled to each of the control terminals of the paralleled power switches by a respective conduction path, and two or more chokes each comprising a pair of windings. The windings of each choke are disposed in different of the conduction paths in a differential mode. At least one of the conduction paths includes at least two windings.

In an eighth aspect, a power switch module includes at least two paralleled power switches each having a respective control terminal, a common power switch driver comprising a single gate drive signal output coupled to each of the control terminals of the paralleled power switches by a respective conduction path, one or more chokes each comprising a pair of windings, and a plurality of capacitances coupled between the control terminals of the power switches. The windings of each choke are disposed in different of the conduction paths in a differential mode. At least one of the conduction paths includes at least two windings.

Each of the first, second, third, fourth, fifth, sixth, seventh, and eighth aspects can include one or more of the following features. The power switches are IGBTs, MOSFETs, or HEMTs. Each aspect can include a second distribution choke to distribute the gate drive signal, e.g., a second distribution choke that includes a third winding disposed in the first conduction path. Each aspect can include a third power switch paralleled with the first and the second power switches and having a third gate and a third conduction path to couple the gate drive signal to the third gate. The second distribution choke can include a fourth winding disposed in the third conduction path.

Each aspect can include a third distribution choke to distribute the gate drive signal. The third distribution choke can include a fifth winding disposed in the third conduction path. The third distribution choke can include a sixth winding disposed in the second conduction path. In each aspect, all parts can be integrated in one power module. In each aspect, the power switches can all be IGBTs, MOSFETs, or HEMTs. In each aspect, the first conduction path can include a first gate resistance and the second conduction path can include a second gate resistance. In each aspect, the first conduction path and the second conduction path can include a common gate resistance. In each aspect, the common power switch driver can be a common gate driver that includes one or more gate signal outputs or with separated Hi/Lo gate outputs. In each aspect, the device or the power switch module can include an equal number of paralleled power switches and chokes and each of the conduction paths can include at least two windings.

Each aspect can include a second distribution choke to distribute the gate drive signal, the second distribution choke comprising a third winding disposed in the first conduction path. Each aspect can include a third IGBT paralleled with the first and the second IGBTs and having a third gate and a third conduction path to couple the gate drive signal to the third gate. In each aspect, the second distribution choke can include a fourth winding disposed in the third conduction path. Each aspect can include a third distribution choke to distribute the gate drive signal, the third distribution choke comprising a fifth winding disposed in the third conduction path. For example, the third distribution choke can include a sixth winding disposed in the second conduction path. The first conduction path can include a first gate resistance and the second conduction path can include a second gate resistance.

In each aspect, the first conduction path and the second conduction path can include one or more first conductors between the IGBT driver and the distribution choke, the first conduction path can include one or more second conductors between the distribution choke and the first gate, the second conduction path can include one or more third conductors between the distribution choke and the second gate, the one or more second conductors can be longer than the one or more first conductors, and the one or more third conductors can be longer than the one or more first conductors.

In each aspect, the first conduction path can include a first gate resistance disposed between the first winding and the gate of the first voltage-controlled power switch, and the second conduction path comprises a second gate resistance disposed between the second winding and the gate of the second voltage-controlled power switch. Each aspect can include a second differential choke comprising a third winding and a fourth winding, wherein the first conduction path comprises the third winding. Each aspect can include a third voltage-controlled power switch having a gate and a pair of main terminals, wherein one of the main terminals of the third voltage-controlled power switch is coupled to the coupled of main terminals of the first and second voltage-controlled power switch. The gate drive signal output can be coupled by a third conduction path to the gate of the third voltage-controlled power switch. The third conduction path can include the fourth winding. In each aspect, the power switches can be IGBTs and the common power switch driver can be a common IGBT driver. The conduction paths can include a common gate resistance. In each aspect, the power switch module can include an equal number of paralleled power switches and chokes and each of the conduction paths can include at least two windings.

In each aspect, there can be at least one discrete capacitor for each conduction path. In each aspect, a first end of each capacitance can be coupled to the control terminal of a power switch and a second end of each capacitance is coupled to another capacitance. In each aspect, the second ends of all capacitances can be coupled together to form a capacitive clamping circuit. In each aspect, a resistor can be coupled to each capacitance. In each aspect, a first end of the resistor can be coupled to the first end of the respective capacitor and a second end of the resistor can be coupled to the second end of the capacitor.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Figure 1:
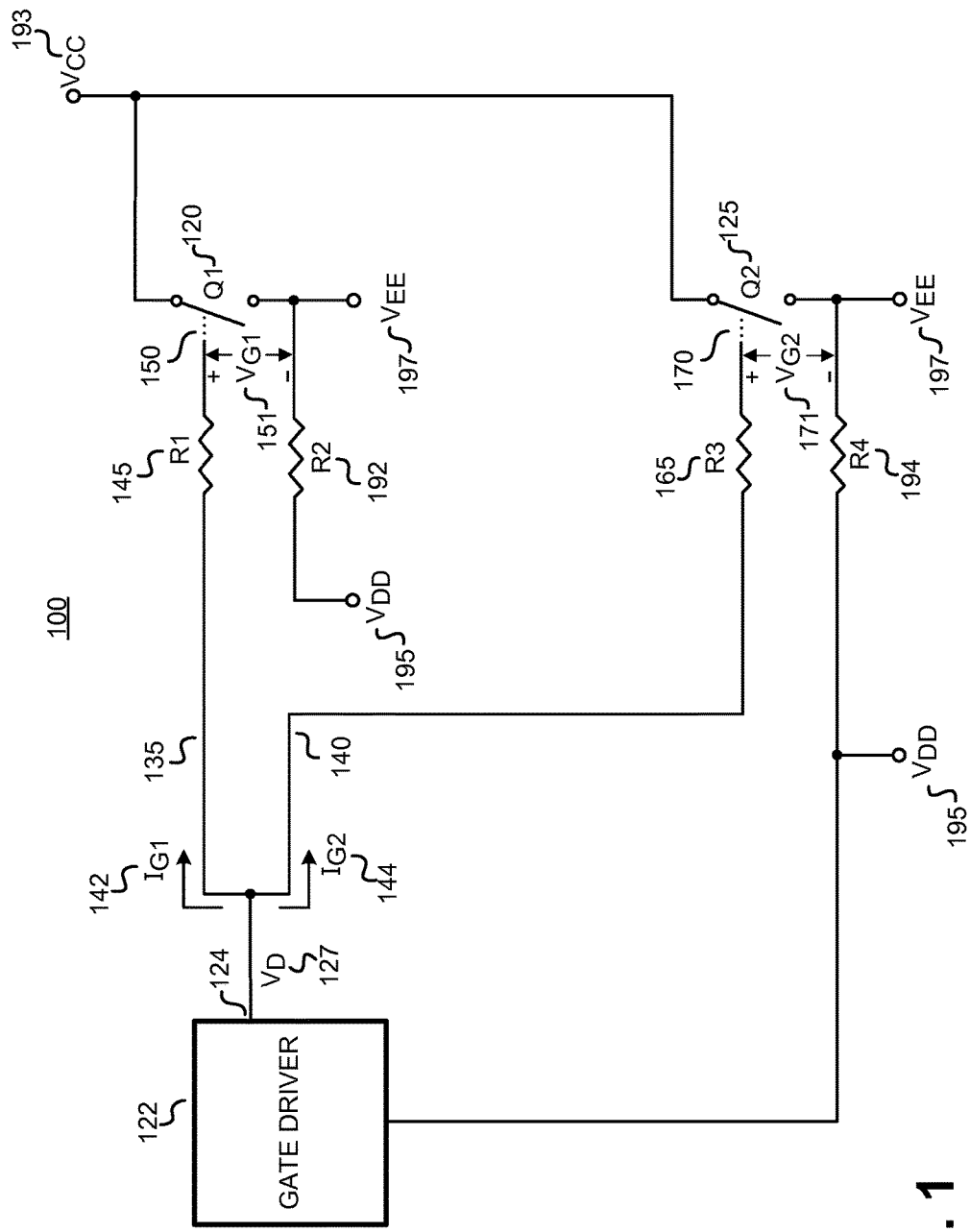
FIG. 1 is a schematic representation of a traditional system in which a pair of voltage-controlled power switches is paralleled to switch a common collector (drain) current.

The switching of the different power switches either as an individual switch or as a plurality of switches combined within a power module package should be carefully coordinated. For example, if a power switch either begins switching into conduction too early or finishes switching out of conduction too late, an unduly large current may be conducted by that or an adjacent power switch. As another example, if the on-state impedance of one power switch is relatively lower than the on-state impedance of other paralleled switches, then the excess current flow through the lower impedance power switch will cause that switch to heat up which may result in damage and/or failure of the module. This can result even though some power semiconductor devices have a positive temperature coefficient and increased impedance as temperature increases.

One class of power switches that has relatively favorable device characteristics is insulated-gate bipolar transistors (IGBTs). IGBTs are three terminal semiconductor devices that generally include four regions of semiconductor material with alternating conductivity types. For example, IGBTs can include an n-type emitter region, a p-type body, an n-type drift region, and a p-type emitter injection region. The three terminals of an IGBT are typically known as gate, emitter, and collector.

Current conduction between the collector and emitter of an IGBT is controlled by an insulated gate structure, generally, a metal-oxide-semiconductor (MOS) gate. If the insulation beneath the insulated gate were ideal, the only current that would flow into and out of the insulated gate would be the current that charges and discharges the leakage or stray capacitance of the gate. The current flow into and out of an insulated gate in even non-ideal IGBTs is both relatively small and variable (e.g., with temperature) and IGBTs are often referred to as "voltage-controlled devices". This reflects the nearly-universal practice of designers to set the voltage between the gate and the emitter, rather than current flow into and out of the insulated gate, to control current flow between the collector and emitter. Nevertheless, IGBT switching behavior may also be attributed to the gate current $I_G$.

IGBTs can generally provide relatively small forward conduction voltage drops and large current-carrying capability in combination with the high input impedance of an insulated gate. At this time, IGBTs are commonly used in commercial applications to switch voltages in excess of up to 6500V and currents in excess of up to 3600 A per module. IGBTs have been used in various applications, such as wind and solar power generation, inductive heating and welding, transportation (e.g., electric vehicles and trains), consumer and industrial applications. Multiple or single IGBT switches are often assembled into IGBT modules with a single gate terminal.

Devices, systems, and methods for paralleling of power switches using a differential mode choke, also referred to as distribution choke hereafter, are described. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale. The teachings of the disclosed invention may be more beneficial in high power applications, however, are not limited to high power applications only. The disclosed invention may be used in applications with output power within any power range. In one implementation, a device includes IGBTs coupled in parallel as power switches. The example implementation includes a gate driver coupled to output a gate drive signal to drive the gates of IGBTs. It should be noted that in another implementation, any other type of power switch, e.g., MOSFETs, HMETs, made using semiconductor materials such as silicon, silicon carbide, gallium nitride, or other suitable semiconductor materials may be used in accordance with the teachings of the present invention. Therefore, the term IGBT or power switch may be interchangeably used hereafter in the specification.

As stated before, IGBTs have three terminals, namely—gate, emitter, and collector. MOSFETs and HEMTs also typically have three terminals, namely—gate, source, and drain. The gate and collector terminals of an IGBT are analogous to the gate and drain terminals of a MOSFET or a HEMT, respectively. The emitter terminal of an IGBT is analogous to the source terminal of a MOSFET or a HEMT. Since the disclosed invention may be generally related to any type of power switches such as MOSFETs or HEMTs, hereafter, throughout the specification the term "drain" may be interchanged with "collector" and the term "emitter" may be interchanged with "source."

The present disclosure describes paralleling power switches and coupling the power switches to a common gate drive circuit using distribution mode chokes. As will be discussed later, a distribution mode choke is coupled between the common gate driver and the gate of each power switch. The distribution choke may be referred to as a coupled inductor with two windings. There is a distribution choke disposed between any two power switches. As will be explained later, in a system thus coupled helps make the gate currents of paralleled power switches substantially equal. This may lead to a better efficiency in all kinds of applications with various power ranges or ratings.

FIG. 1 is a schematic representation of a system 100 in which a pair of voltage-controlled power switches, namely, power switches Q1 120 and Q2 125 are paralleled or coupled in parallel to switch a common collector (drain) voltage $V_{CC}$ 193 to a load (not shown in FIG. 1), resulting in a switched current to the load. For the purpose of this specification paralleled is a term used to refer to a topology in which a plurality of power switches are driven by a common gate driver or responsive to a common gate drive voltage or a signal; with their collectors (drains) coupled to a common positive supply rail voltage and emitters (sources) coupled to a common negative supply rail voltage. In some examples, there may be impedance in the collector (drain) paths and the emitter (source) paths. For the purpose of this specification, power switches coupled as such may be referred to as paralleled power switches.

FIG. 1 illustrates a traditional system in which distribution chokes are not used. In one example the common collector (drain) voltage $V_{CC}$ 193 is a positive supply rail voltage and voltage $V_{EE}$ 197 is a negative supply rail voltage. As stated before, the power switches may be devices such as IGBTs, MOSFETs, HEMTs, etc. Thus, it may be appreciated that depending on the type of power switch used, the collectors or drains of both power switches are coupled together to the positive supply rail voltage $V_{CC}$ 193. The emitters or sources of both power switches are coupled together to the negative supply rail voltage $V_{EE}$ 197. For the purpose of this specification, the emitters of both power switches may also referred to as emitter return lines. System 100 includes a gate driver 122 that outputs a gate drive voltage $V_D$ 127 at a gate drive voltage output 124. The return line of the gate driver 122 is coupled to a voltage $V_{DD}$ 195. Gate driver 122 is coupled by different conduction paths to the control terminals 150, 170 of power switches Q1 120, Q2 125 such that the power switches Q1 120, Q2 125 receive the gate driver voltage $V_D$ 127. As a result, there are positive, zero, or negative voltages $V_{G1}$ 151 and $V_{G2}$ 171 with respect to the emitter return voltage $V_{EE}$ 197 at the control terminals 150 and 170 of the power switches Q1 120 and Q2 125 respectively. Gate driver 122 thus controls power switches Q1 120, Q2 125 into (with positive voltage $V_{G1}$ 151, $V_{G2}$ 171) and out (with zero or negative voltage $V_{G1}$ 151, $V_{G2}$ 171) of conduction.

The conduction path that couples the gate drive voltage output 124 to gate 150 of power switch Q1 120 includes a gate drive signal conductor 135 and a gate resistance 145. The conduction path that couples the gate drive voltage output 124 to gate 170 of the power switch Q2 125 includes a gate drive signal conductor 140 and a gate resistance 165. Conductors 135, 140 and indeed all of the conductors described herein are real world conductors and inherently have a finite non-zero resistance and parasitic interactions with their environment. Because gates 150, 170 of power switches Q1 120, Q2 125 are insulated from the conductive channels between the respective collector (drain) and emitter (source) of power switches Q1 120, Q2 125, the currents $I_{G1}$, $I_{G2}$ conducted along gate drive signal conductors 135, 140 are relatively small and mainly associated with charging and discharging of the parasitic capacitances and inductances of gate drive signal conductors 135, 140 and gates 150, 170. The voltages $V_{G1}$ 151, $V_{G2}$ 171 at the control terminals 150, 170 of power switches Q1 120, Q2 125 thus only differ from the gate drive voltage $V_D$ 127 to a relatively small extent, primarily during switching when the rate of change in gate drive voltage $V_D$ 127 and voltages $V_{G1}$ 151, $V_{G2}$ 171 is highest.

In order to help ensure that the switching of power switches Q1 120 and Q2 125 is nearly simultaneous, reductions may be attempted in both: (1) differences between the voltages $V_{G1}$ 151, $V_{G2}$ 171 applied to gates 150, 170 of IGBTs Q1 120 and Q2 125 respectively; and (2) differences between the device characteristics of power switches Q1 120, Q2 125.

For example, power switches Q1 120 and Q2 125 may be manufactured with very tight tolerances. The lengths, positioning, and physical properties of gate drive signal conductors 135, 140 are designed to be as close to identical as possible. However, in a real world application, this may be difficult to achieve for various reasons. The resistances of gate resistances R1 145, R3 165 may be as close to identical as possible. The characteristics of the emitter return lines are chosen such that the reference potential is nearly identical at different locations. Resistors R2 192 and R4 194 are used for limiting cross currents between the emitters (sources) of power switches Q1 120 and Q2 125. A first of end of resistors R2 192, R4 194 is coupled to the emitter return line and a second end of R2 192, R4 194 is coupled to the gate return line voltage $V_{DD}$ 195.

Figure 2A:
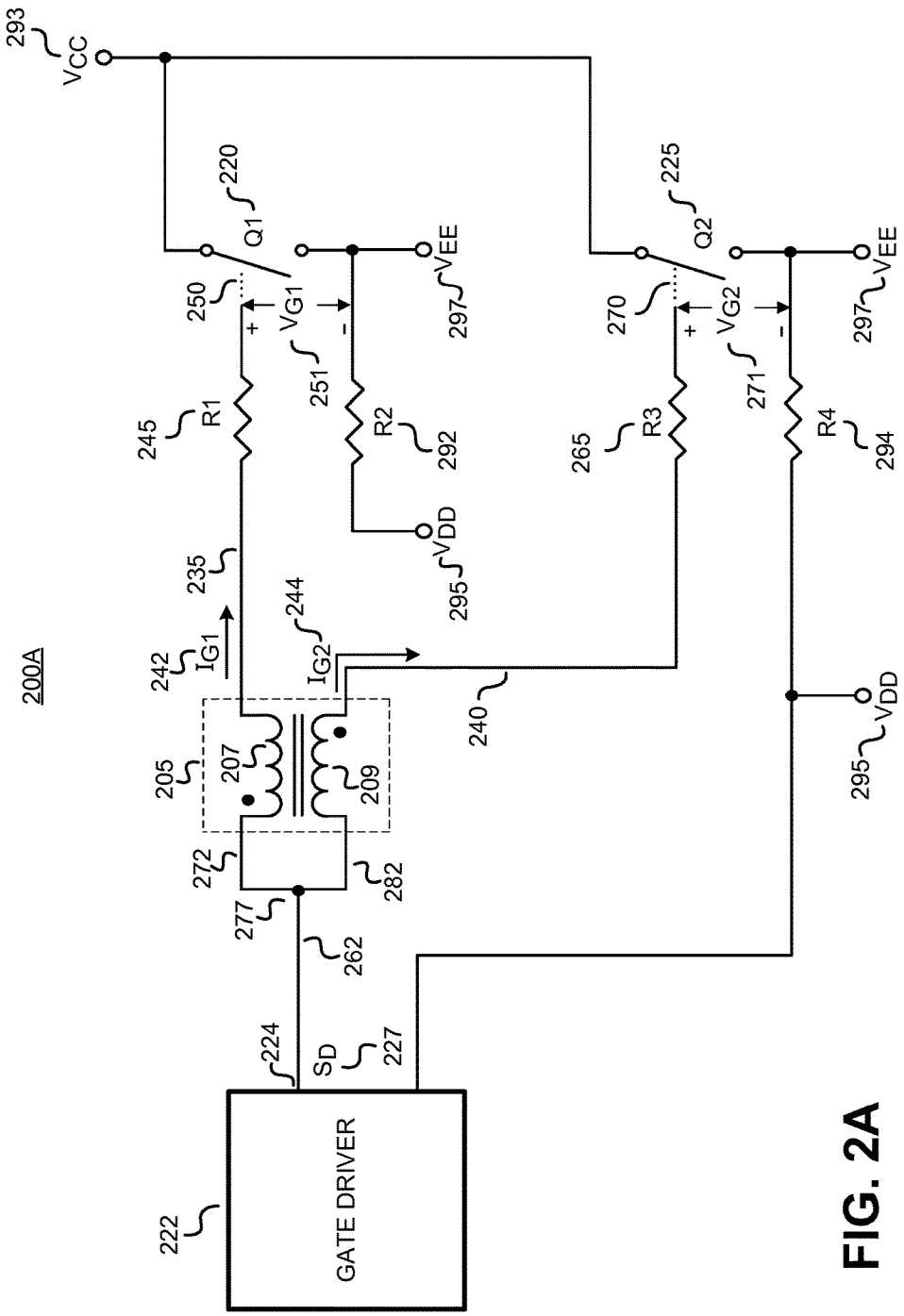
FIG. 2A is a schematic representation of a system that uses a distribution choke for paralleling a pair of voltage-controlled power switches to switch a common collector (drain) current, in accordance with an embodiment of the present invention.

FIG. 2A is a schematic representation of a system 200A that uses a distribution choke 205 along with a pair of voltage-controlled power switches coupled in parallel, namely power switches Q1 220, Q2 225, to switch voltage $V_{CC}$ 293. For the purpose of this specification paralleled is a term used to refer to a topology in which a plurality of power switches are driven by a common gate driver or responsive to a common gate drive voltage or a signal; with their collectors (drains) coupled to a common positive supply rail voltage and emitters (sources) coupled to a common negative supply rail voltage. In some examples, there may be impedance in the collector (drain) paths and the emitter (source) paths. For the purpose of this specification, power switches coupled as such may be referred to as paralleled power switches.

In one example the common collector (drain) voltage $V_{CC}$ 293 is a positive supply rail voltage and voltage $V_{EE}$ 297 is a negative supply rail voltage. Thus, it may be appreciated that depending on the type of power switch used, the collectors or drains of both power switches are coupled together to the positive supply rail voltage $V_{CC}$ 293. The emitters or sources of both power switches are coupled together to the negative supply rail voltage $V_{EE}$ 297. The power switches Q1 220 and Q2 225 may represent IGBTs, MOSFETs, HEMTs or any other similar semiconductor device made using silicon, silicon carbide, gallium nitride, or other suitable semiconductor materials.

System 200A includes a gate driver 222 that outputs a common gate drive signal $S_D$ 227 at a gate drive signal output 224. The return line of the gate driver 222, also referred to as a driver return line, is coupled to a voltage $V_{DD}$ 295. In another embodiment of system 200A or any embodiments described later in the specification, the driver return line may be coupled to ground. The gate drive signal $S_D$ 227 may be a voltage signal or a current signal. The gate drive signal $S_D$ 227 is coupled by different conduction paths to the gates 250, 270 of power switches Q1 220, Q2 225 respectively. As a result, there are voltages $V_{G1}$ 251, $V_{G2}$ 271, which are positive, zero or negative with respect to the emitter return voltage $V_{EE}$ 297, at gates 250, 270 of power switches Q1 220, Q2 225 respectively. Gate driver 222 thus drives power switches Q1 220, Q2 225 into and out of conduction. Distribution choke 205 is illustrated as coupled between the gate driver 222 and power switches Q1 220, Q2 225. In one example, the distribution choke is shown as a coupled inductor with a first winding 207 and a second winding 209. In the example shown, one end of both the first winding 207 and the second winding 209 of the distribution choke 205 are coupled to the gate driver output 224. The other end of the first winding 207 is coupled to the gate of power switch Q1 220 while the other end of the second winding 209 is coupled to power switch Q2 225. As will be further discussed, the distribution choke 205 allows for balancing the gate currents $I_{G1}$ 242, $I_{G2}$ 244 of the power switches Q1 220 and Q2 225. The conduction path that couples the gate drive signal output 224 to gate 250 of power switch Q1 220 includes conductors 262, 272, a first winding 207 of distribution choke 205, a gate drive signal conductor 235, and a gate resistance R1 245, as well as other conductors. The conduction path that couples gate drive signal output 224 to gate 270 of power switch Q2 225 includes conductors 262, 282, a second winding 209 of the distribution choke 205, a gate drive signal conductor 240, and a gate resistance R3 265, as well as other conductors. The illustrated embodiment of FIG. 2A may be referred to as a discrete gate resistance configuration, since it has individual or discrete gate resistances R1 245, R3 265 coupled to the gates of power switches Q1 220, Q2 225 respectively. In another embodiment referred to as a common gate resistance configuration, (not shown in FIG. 2A), the individual gate resistors R1 245 and R3 265 may be replaced by a common gate resistor in the conduction path 262. The value of the common gate resistor may be the effective value of the parallel combination of the resistors R1 245 and R3 265.

In operation, for a discrete gate resistance configuration with resistors R1 245 and R3 265 of equal value, the effective gate resistance $R_{EFF}$ as seen by the gate driver 222 has a value which is substantially equal to the equivalent resistance of the parallel combination of resistors R1 245 and R3 265 or half of the value of R1 245 or R3 265 (in case R1 245 has the same value as R3 265, which is the typical arrangement). In other examples of the discrete gate resistance configuration, where more than two power switches are paralleled, the effective gate resistance $R_{EFF}$ may have a value which is substantially equal to the parallel combination of all the individual gate resistances. In general, if one assumes $R_G$ to be the value of each of the individual gate resistances and N to be the total number of power switches coupled in a parallel configuration, then the effective gate resistance $R_{EFF}$ may be substantially given by the following equation, which assumes that all individual gate resistances have the same value:

$$R_{EFF} = R_G/N \quad (1)$$

In cases were non-equal individual gate resistances may be used the following equation applies, which includes equation (1) as a special case:

$$R_{EFF} = \left(\frac{1}{R_{G(1)}} + \frac{1}{R_{G(2)}} + \ldots + \frac{1}{R_{G(N)}}\right)^{-1} \quad (2)$$

As stated earlier, in an example of a common gate resistance embodiment (not shown in the FIG. 2A), the individual gate resistors may be eliminated and a common gate resistance of a value equal to the effective gate resistance $R_{EFF}$ as calculated by the equation no. 1 or 2, may be placed in the portion of the conduction paths formed by conductor 262. Thus, in one example of common gate resistance configuration, if either of the resistors R1 245 or R3 265 is placed in the portion of the conduction paths formed by conductor 262, then its value will be substantially equal to the half of its corresponding value in a discrete gate configuration in case R1 245 is equal to R3 265. In other examples of the common gate resistance configuration, where more than two power switches are paralleled, the common gate resistance may have a value which substantially equal to the effective gate resistance $R_{EFF}$ as calculated by equation (1) or (2) for the corresponding discrete gate resistance configuration.

Distribution choke 205 is configured and coupled to help ensure that the currents from the distribution choke 205, for example currents $I_{G1}$ 242 and $I_{G2}$ 244, are nearly identical. In the example shown, the current $I_{G1}$ 242 is the current provided from the first winding 207 while the current $I_{G2}$ 244 is the current provided from the second winding 209. As shown by the dot markings, the first and second winding are coupled in the conduction paths in a differential mode, such that the windings present a relatively low impedance to currents entering the distribution choke 205 when those are equal but a relatively high impedance when those same currents are unequal. In other words, the distribution choke presents relatively high impedance to the differences between the currents entering the distribution choke 205.

In a real-world implementation of system 200A, the distribution choke 205 may be disposed at a distance of several cm (e.g. 20 cm) from the gate drive signal output 224. In particular, the gate drive signal output 224 is coupled to the conductor 262 that conducts the current for both of the power switches Q1 220, Q2 225 to a node 277. After the node 277, the current directed to power switch Q1 220 flows along conductor 272 and the current directed to power switch Q2 225 flows along the conductor 282. In general, it may be desirable, but not mandatory due to the distribution choke 205, that conductors 272 and 282 have similar physical characteristics and are tailored to provide similar impedances. Because of the distribution choke 205, currents $I_{G1}$ 242 and $I_{G2}$ 244 from the distribution choke 205 are nearly identical and travel along conductors 235, 240, respectively. Currents $I_{G1}$ 242, $I_{G2}$ 244 flow through the respective gate resistance R1 245, R3 265 to bias the gates 250, 260 of the power switches Q1 220, Q2 225 with voltages $V_{G1}$ 251, $V_{G2}$ 271 respectively.

Typically, in real-world implementations, it is more difficult to make conductors 235, 240, gate resistances R1 245, R3 265, and power switches Q1 220, Q2 225 more nearly identical than it is to make conductors 272 and 282 more nearly identical. For this reason, most of the parasitic and other interactions that could potentially give rise to differences between the voltages $V_{G1}$ 251, $V_{G2}$ 271 at the gates 250, 270 of power switches Q1 220, Q2 225 respectively, are found between the distribution choke 205 and power switches Q1 220, Q2 225. For example, the lengths of conductors 235, 240 between the distribution choke 205 and gate resistances R1 245, R3 265 are typically greater than the lengths of conductors 272, 282 respectively. Furthermore, the difference between the lengths of conductors 235 and 272 maybe greater than the difference between the lengths of conductors 240 and 282. By ensuring that currents $I_{G1}$ 242 and $I_{G2}$ 244 which exit the distribution choke 205 are nearly identical, distribution choke 205 minimizes the impact of such differences and helps ensure that the switching of IGBTs Q1 220, Q2 225 is in symmetry by equalizing the timing behavior of the switching transients, equalizing the gate voltages, and equalizing the load currents. This leads to switching characteristics (including time and losses) that are balanced between the power switches Q1 220, Q2 225. Furthermore, cooling of the power switches Q1 220, Q2 225 can be optimized and utilization of power switches Q1 220, Q2 225 can be increased.

The gate driver 222 is a common driver that outputs a single gate drive signal to drive the gates of power switches Q1 220, Q2 225. In general, this single gate drive signal may turn off and turn on the power switches with asymmetric pulses and both "push-up" and "pull-down" the gate voltages of the power switches. In general, gate driver 222 may include one or more inputs (not shown in FIG. 2A) for receiving timing or control signal(s) (e.g. pulse width modulated signals) characterizing the timing of the switching of the power switches Q1 220, Q2 225. Generally, those timing signals modulate the duration of current conduction by the power switches Q1 220, Q2 225 within a series of periods (i.e., pulse width modulation). The outputted gate drive signal $S_D$ 227 is suitable for controlling power switches Q1 220, Q2 225. For example, the gate currents of the power switches Q1 220, Q2 225 should be sufficiently large to move carriers into and out of the gate region of the power switches Q1 220, Q2 225 at a desired switching speed. Drivers for switching the power switches Q1 220, Q2 225 generally output gate drive signals for instance between +/−10 Volts or +/−15 Volts relative to the power switch emitter (source).

In the illustrated implementation of system 200A, each power switch Q1 220, Q2 225 has an emitter return line coupled between the emitter of the respective power switch Q1 220, Q2 225 and the voltage $V_{EE}$ 297. Further, resistances R2 292, R4 294 are coupled between the emitters of the power switches Q1 220, Q2 225 respectively and the gate driver return line 295. Resistances R2 292, R4 294, also referred to as return line resistances R2 292 and R4 294, have a resistance selected to suppress currents from flowing between the respective emitters (sources) of power switches Q1 220, Q2 225. In general, return line resistances R2 292 and R4 294 may be part of the gate resistors and may influence the gate currents $I_{G1}$ 242 and $I_{G2}$ 244 as well. Differences in the return line, such as differences between the return line impedances, are also compensated by the distribution choke 205.

Figure 2B:
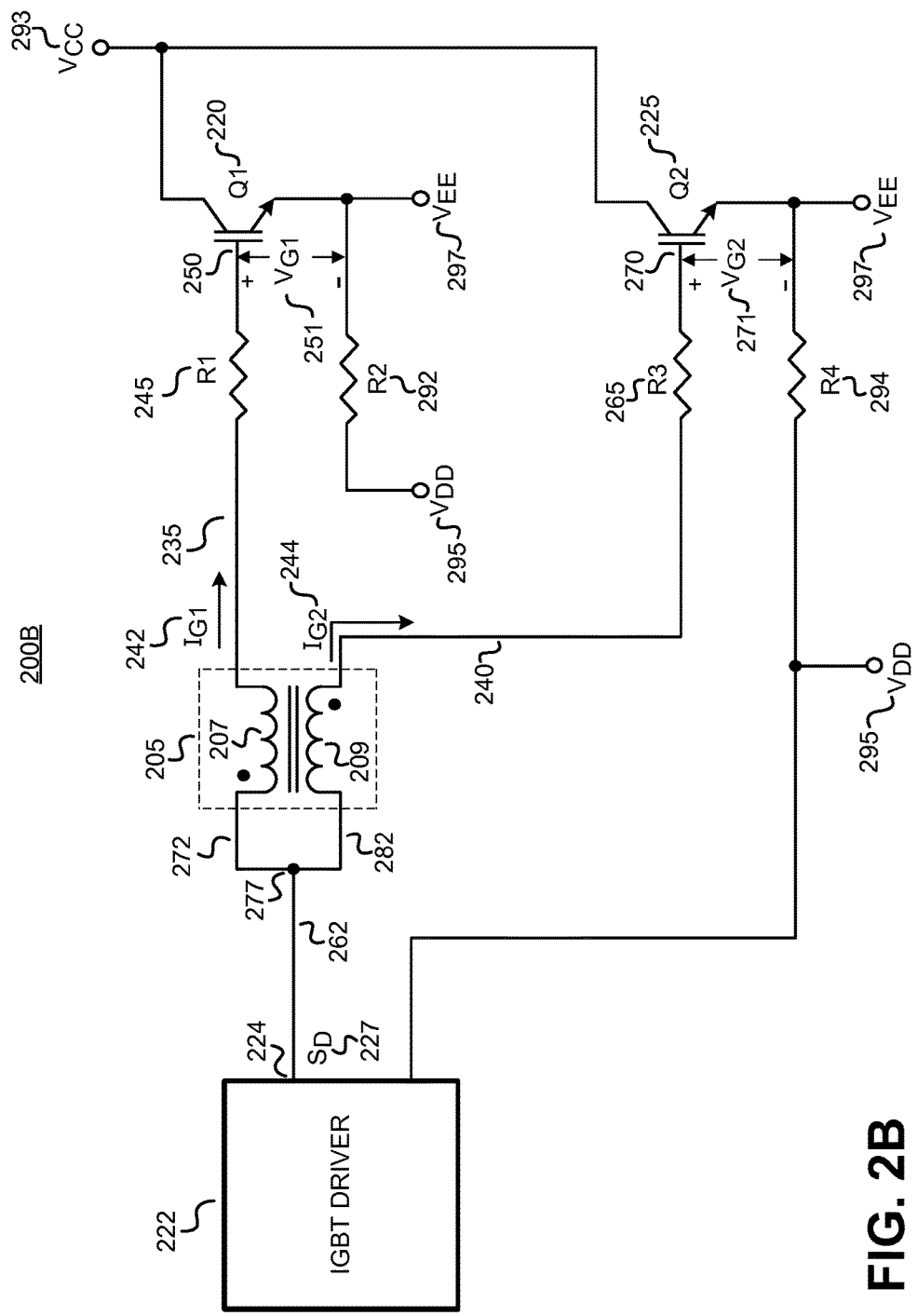
FIG. 2B is a schematic representation of a system that uses a distribution choke for paralleling a pair of IGBTs to switch a common collector current, in accordance with an embodiment of the present invention.

FIG. 2B is a schematic representation of a system 200B, which is another example of a system that uses a distribution choke 205 along with a pair of voltage-controlled IGBT switches coupled in parallel, namely, Q1 220, Q2 225, to switch a common collector (drain) voltage $V_{CC}$ 293. The collectors of both power switches Q1 220, Q2 225 are coupled together to the positive supply rail voltage $V_{CC}$ 293. The emitters of both the IGBTs Q1 220, Q2 225, also referred to as emitter return lines, are coupled together to the negative supply rail voltage $V_{EE}$ 297. The IGBT driver 222 works in a similar way as the gate driver 222 illustrated in FIG. 2A. The return line of the IGBT driver 222 is coupled to a voltage $V_{DD}$ 295. FIG. 2B has been included for the purpose of illustrating how the described invention can be used with IGBTs as power switches. All circuit elements of system 200B function and couple in a similar fashion as system 200A illustrated in FIG. 2A.

A schematic illustration of the advantages of coupling the distribution choke 205 is illustrated in scope captures 300A, 300B, 300C, 300D, 300E, 300F, 300G, and 300H (FIG. 3A, FIG. 3B, FIG. 3C, FIG. 3D, FIG. 3E, FIG. 3F, FIG. 3G, and FIG. 3H) in accordance with the teachings of the present invention.

FIGS. 3A, 3C, 3E, and 3G are scope captures 300A, 300C, 300E, and 300G that illustrate the switching of a pair of paralleled IGBTs by a common gate driver without a distribution choke. Scope capture 300A includes traces 320 and 322. Scope capture 300C trace includes traces 325 and 327. Scope capture 300E trace includes traces 330 and 332. Scope capture 300G trace includes traces 335 and 337. Scope captures 300A, 300C, 300E, 300G include an x-axis 310 and a y-axis 315. Position along x-axis 310 indicates time. Position along y-axis 315 indicates the magnitude of either current or voltage, depending on the relevant trace. Although the time scale along x-axis 310 is identical for all of the illustrated traces, the scale of the current or voltage along y-axis 315 may vary for the different traces.

FIGS. 3B, 3D, 3F, and 3H are scope captures 300B, 300D, 300F, and 300H illustrating the switching of a pair of parallel IGBTs by a common gate driver with a distribution choke as illustrated in FIG. 2B. Scope capture 300B trace includes traces 360 and 362. Scope capture 300D trace includes traces 365 and 367. Scope capture 300F trace includes traces 370 and 372. Scope capture 300H trace includes traces 375 and 377.

Figure 3A:
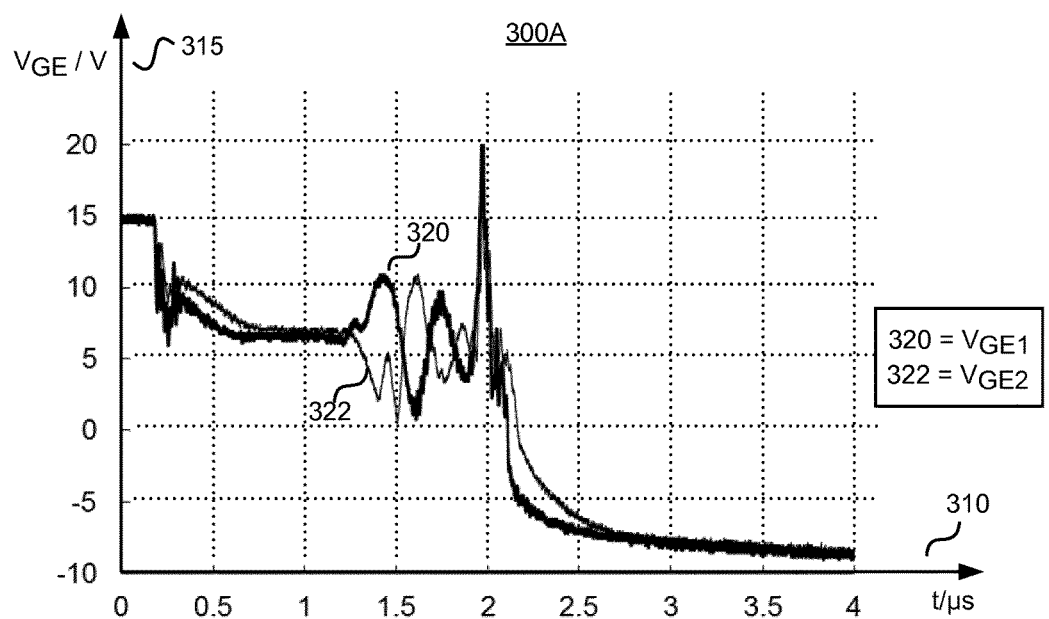
FIGS. 3A, 3B, 3C, 3D, 3E, 3F, 3G, and 3H are scope captures 300A, 300B, 300C, 300D, 300E, 300F, 300G, and 300H comparing the switching of a pair of paralleled IGBTs by a common gate driver without a distribution choke (scope captures 300A, 300C, 300E, and 300G) and with a distribution choke (scope captures 300B, 300D, 300F, and 300H).

FIG. 3A trace includes traces 320 and 322. Trace 320 represents the potential difference $V_{GE1}$ between the gate and emitter of the first of the pair of power switches during the transition from the on-state to the off-state. Trace 322 represents the potential difference $V_{GE2}$ between the gate and emitter of the second of the pair of power switches during the transition from the on-state to the off-state. In some implementations, $V_{GE1}$ and $V_{GE2}$ can range between +/−15 Volts approximately, instead of +15 Volts and −10 Volts as shown here. Other positive and negative gate voltages are also possible in real-world applications (e.g. +20 Volts/0 Volt, +18 Volts/−6 Volts).

As can be seen, both traces 320, 322 transition from the same relatively higher potential difference in the on-state to the same, nearly steady relatively lower potential difference in the off-state. However, the potential difference between the gate and emitter $V_{GE1}$ of the first of the power switches and $V_{GE2}$ of the second of the power switches is not zero, i.e. $V_{GE1}$ and $V_{GE2}$ are not equal during the transition period. This is caused by different impedances in the conduction paths of the individual power switches, resulting in different gate currents $I_{G1}$ and $I_{G2}$. FIG. 3C illustrates the gate currents $I_{G1}$ and $I_{G2}$ as traces 325 and 327, respectively. Trace 325 represents the gate current $I_{G1}$ of the first of the pair of power switches during the transition from the on-state to the off-state. Trace 327 represents the gate current $I_{G2}$ of the second of the pair of power switches during the transition from the on-state to the off-state. At the end of the transition both $V_{GE1}$ and $V_{GE2}$ are substantially equal, indicating the end of the turn-off switching event. As can be seen in the traces 325, 327 of FIG. 3C, both gate currents $I_{G1}$, $I_{G2}$ start at nearly zero in the on-state. However, during the transition phase, gate currents $I_{G1}$, $I_{G2}$ are not equal. The differences between gate current $I_{G1}$ and gate current $I_{G2}$ are the result of imperfect matching of the gate capacitance and other characteristics of the power switches, the lengths, positioning, and physical properties of the gate drive signal conductors, the resistances of the gate resistances and the like. In other words, the gate loop impedance for both switches is not exactly equal. In some other embodiments, the peak values of the gate currents for the first and second power switch may be up to 50 amps.

Figure 3B:
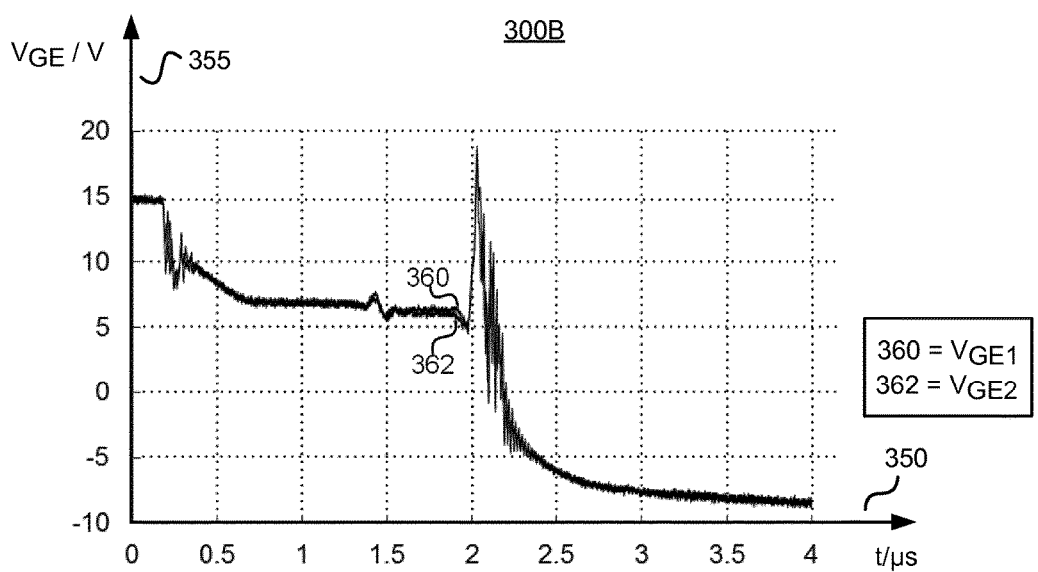
Figure 3C:
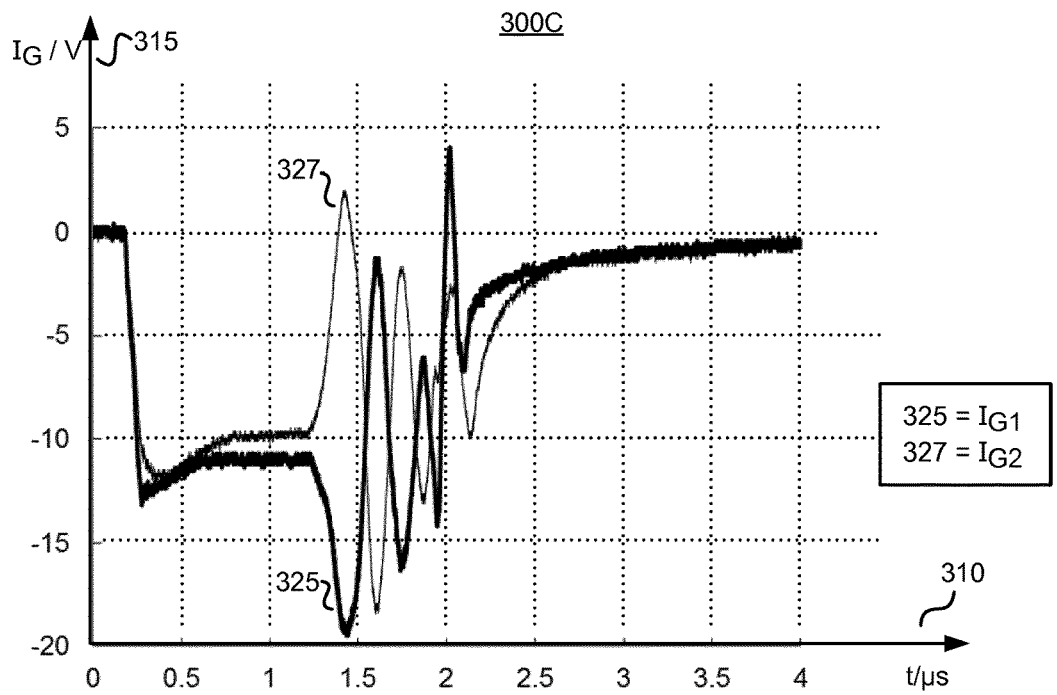
Figure 3D:
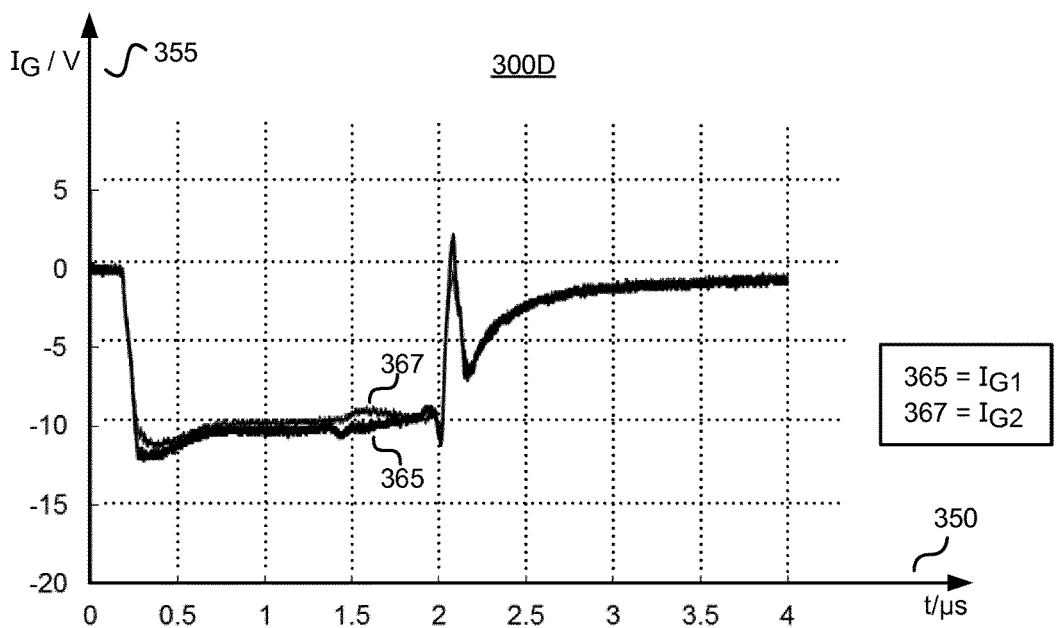
Figure 3E:
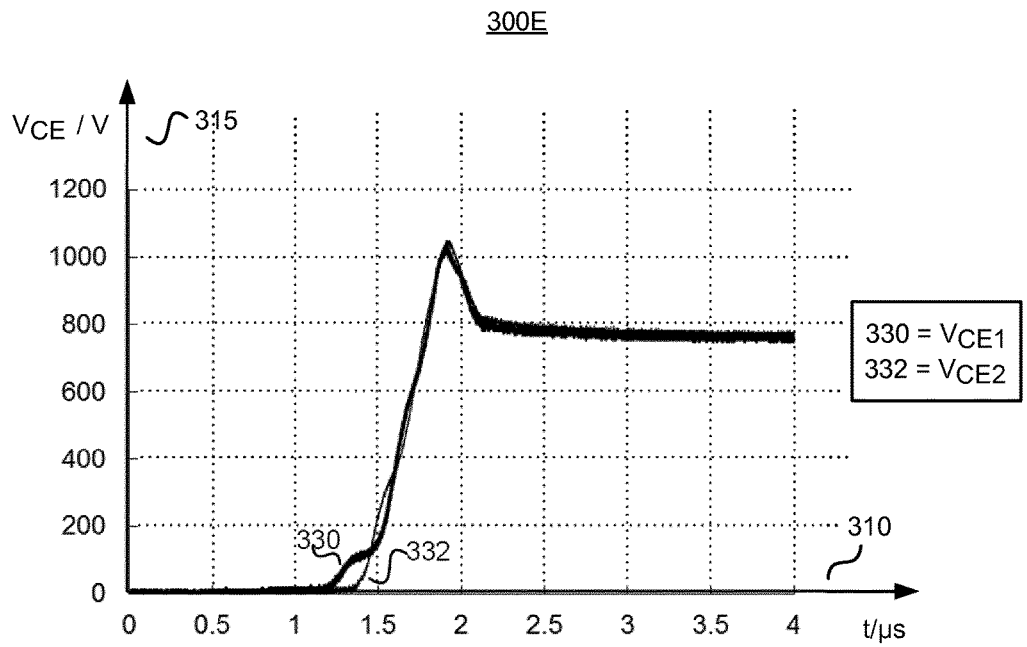

FIG. 3E trace includes traces 330 and 332. Trace 330 represents the potential difference between the collector (drain) and emitter (source) $V_{CE1}$ of a first of the pair of IGBTs during switching from an on-state to an off-state. Trace 332 represents the potential difference between the collector (drain) and emitter (source) $V_{CE2}$ of the second of the pair of IGBTs during switching from a more conductive on-state to a less conductive off-state. In some implementations, $V_{CE1}$ and $V_{CE2}$ can be several hundred volts or more. As can be seen, both traces 330, 332 transition from the same relatively low potential difference in the on-state to the same relatively high potential difference in the off-state. However, the potential difference between the collector and emitter $V_{CE1}$ of the first of the IGBTs begins to rise before the potential difference between the collector and emitter $V_{CE2}$ of the second of the IGBTs. This early increase in potential difference is associated with the first of the IGBTs turning off more quickly than the second of the IGBTs.

Figure 3F:
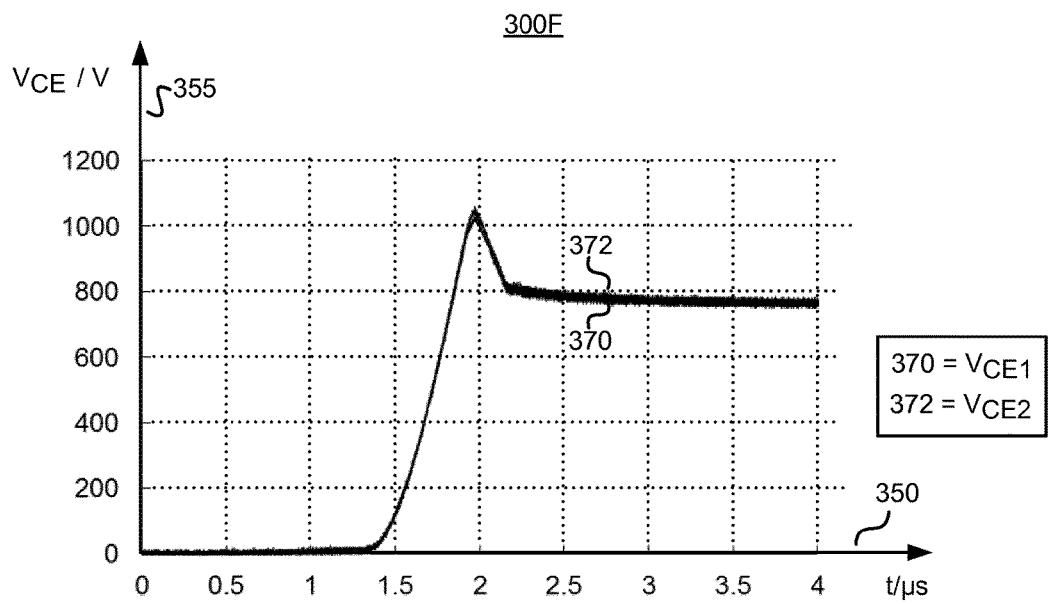
Figure 3G:
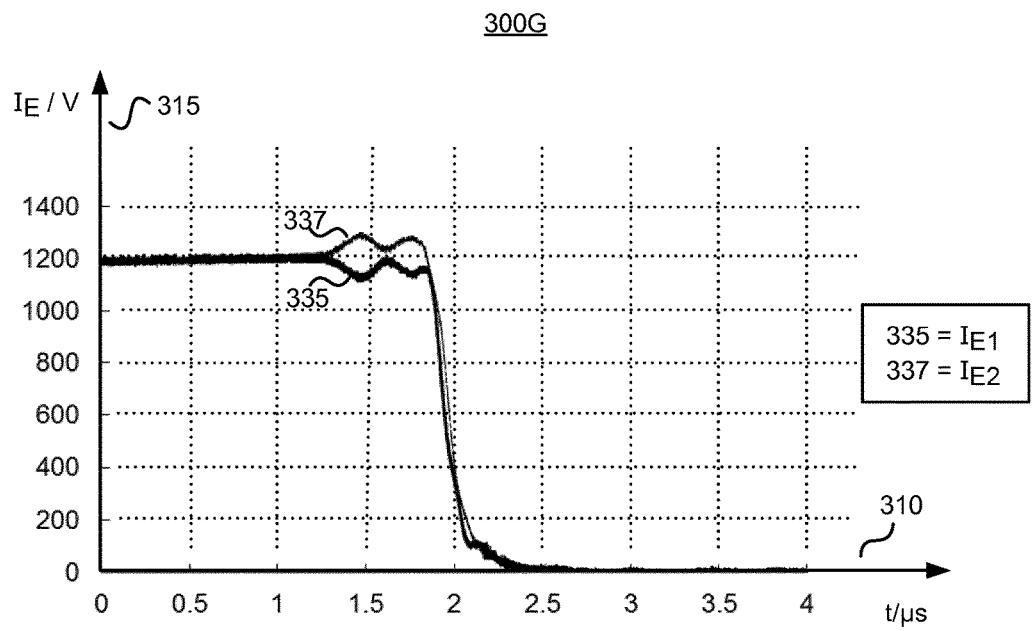

FIG. 3G trace includes traces 335 and 337. Trace 335 represents the emitter current $I_{E1}$ of the first of the pair of IGBTs during the transition from the on-state to the off-state. Trace 337 represents the emitter current $I_{E2}$ of the second of the pair of IGBTs during the transition from the on-state to the off-state. In some implementations, $I_{E1}$ and $I_{E2}$ may be approximately more than several thousand amps.

As can be seen, both traces 335 and 337 start at steady or nearly equal values in the on-state. During the transition phase, the emitter currents $I_{E1}$ and $I_{E2}$ of the parallel power switches are not equal. The difference between $I_{E1}$ and $I_{E2}$ is due to the unequal gate switching of the related IGBTs. The magnitude of emitter current $I_{E1}$ decreases whereas the magnitude of emitter current $I_{E2}$ increases during switching of the IGBTs from the on-state to the off-state.

Traces 300B, 300D, 300F, and 300H include an x-axis 350 and a y-axis 355. Position along x-axis 350 indicates time. Position along y-axis 355 indicates the magnitude of either current or voltage, depending on the relevant trace. Although the time scale along x-axis 350 is identical for all of the illustrated traces, the scale of the current or voltage along y-axis 355 varies for the different traces. For the sake of comparison, the time scales along x-axes 310, 350 are considered to be identical. Also, the current scales or voltage scales along y-axes 315 and 355 are identical for corresponding traces.

FIG. 3B trace includes traces 360 and 362 representing gate-to-emitter potential differences of a pair of IGBTs coupled as shown in FIG. 2B. Trace 360 represents the potential difference $V_{GE1}$ between the gate and emitter of the first of the pair of IGBTs during switching from the on-state to the off-state. Trace 362 represents the potential difference $V_{GE2}$ between the gate and emitter of the second of the pair of IGBTs during switching from the on-state to the off-state. In some implementations, $V_{GE1}$ and $V_{GE2}$ can range between +/−15 volts approximately, instead of +15 Volts and −10 Volts as illustrated in the traces 300A and 300B. As illustrated in the scope capture 300B, trace 360 and trace 362 transition from the same relatively higher potential difference in the on-state to the same, nearly steady relatively lower potential difference in the off-state. However, relative to scope capture 300A (FIG. 3A), the potential difference between the gate and emitter $V_{GE1}$ of the first of the IGBTs is more closely matched to the potential difference between the gate and emitter $V_{GE2}$ of the second of the IGBTs. As can be seen from scope capture 300B, the traces 360 and 362 substantially overlap. This closer match indicates that with a distribution choke the first of the IGBTs is better coordinated with the second of the IGBTs than without a distribution choke.

FIG. 3D trace includes traces 365 and 367 representing gate currents of a pair of IGBTs coupled as shown in FIG. 2B. Trace 365 represents the gate current $I_{G1}$ of the first of the pair of IGBTs during switching from the on-state to the off-state. Trace 367 represents the gate current $I_{G2}$ of the second of the pair of IGBTs during switching from the on-state to the off-state. As can be seen in the scope capture 300D, both the traces 365, 367 start at steady, nearly zero value in the on-state. However, relative to scope capture 300C (FIG. 3C), the magnitude of gate current $I_{G1}$ is more closely matched to the magnitude of gate current $I_{G2}$. As can be seen from scope capture 300D, the traces 365 and 367 substantially overlap. The closer matching of gate current $I_{G1}$ and gate current $I_{G2}$ occurs despite the same imperfect matching of the gate capacitance and other characteristics of the IGBTs, the lengths, positioning, and physical properties of gate drive signal conductors, the resistances of gate resistances, and the like as without a distribution choke.

FIG. 3F trace includes traces 370 and 372 representing collector-to-emitter potential differences of a pair of IGBTs coupled as shown in FIG. 2B. Trace 370 represents the potential difference between the collector and emitter $V_{CE1}$ of a first of the pair of IGBTs during switching from a more conductive on-state to a less conductive off-state. Trace 372 represents the potential difference between the collector and emitter $V_{CE2}$ of the second of the pair of IGBTs during switching from a more conductive on-state to a less conductive off-state. As can be seen in scope capture 300F, both traces 370, 372 transition from the same relatively low potential difference in the on-state to the same relatively high potential difference in the off-state. However, relative to scope capture 300E, the potential difference between the collector and emitter $V_{CE1}$ of the first of the IGBTs is more closely matched to the potential difference between the collector and emitter $V_{CE2}$ of the second of the IGBTs. As can be seen from scope capture 300F, the traces 370 and 372 substantially overlap. This closer match indicates that with a distribution choke the first of the pair of IGBTs turns off more nearly simultaneously with the second of the IGBTs than without a distribution choke.

Figure 3H:
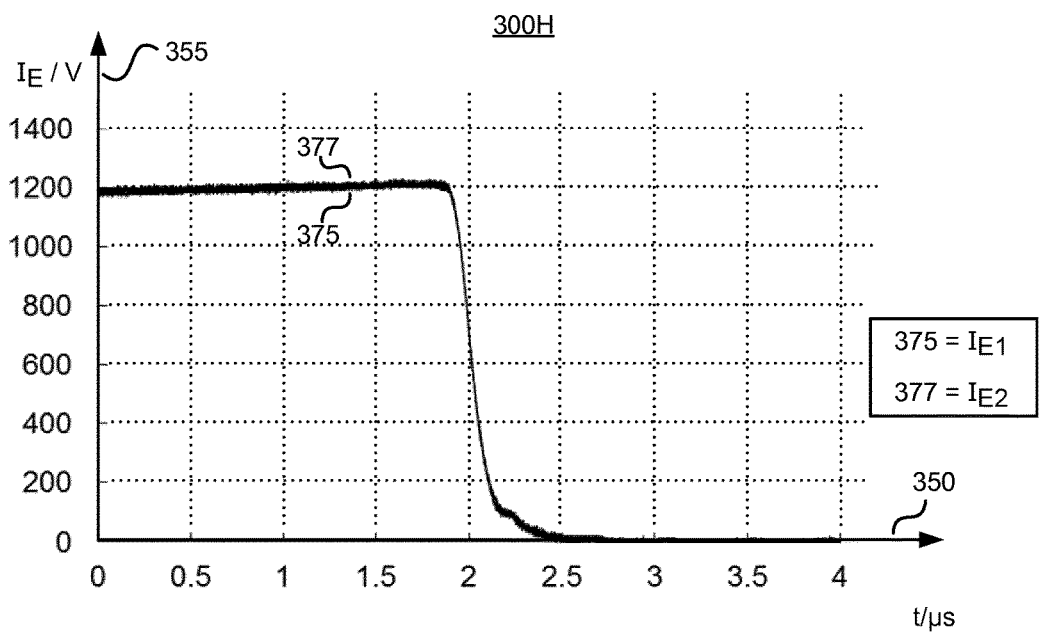

FIG. 3H trace includes traces 375 and 377 representing emitter currents of a pair of IGBTs coupled as shown in FIG. 2B. Trace 375 represents the emitter current $I_{E1}$ of the first of the pair of IGBTs during switching from the on-state to the off-state. Trace 377 represents the emitter current $I_{E2}$ of the second of the pair of IGBTs during switching from the on-state to the off-state. In some implementations, $I_{E1}$ and $I_{E2}$ can be more than several hundred amperes. In scope capture 300H, both traces 375, 377 start at steady, nearly equal values in the on-state. However, relative to scope capture 300G (FIG. 3G) the magnitude of the decrease in emitter current $I_{E1}$ and the magnitude of the increase in emitter current $I_{E2}$ during switching from the on-state to the off-state are both nearly equal. As can be seen from scope capture 300H, the traces 375 and 377 substantially overlap. This indicates that emitter current sharing is improved.

Figure 4:
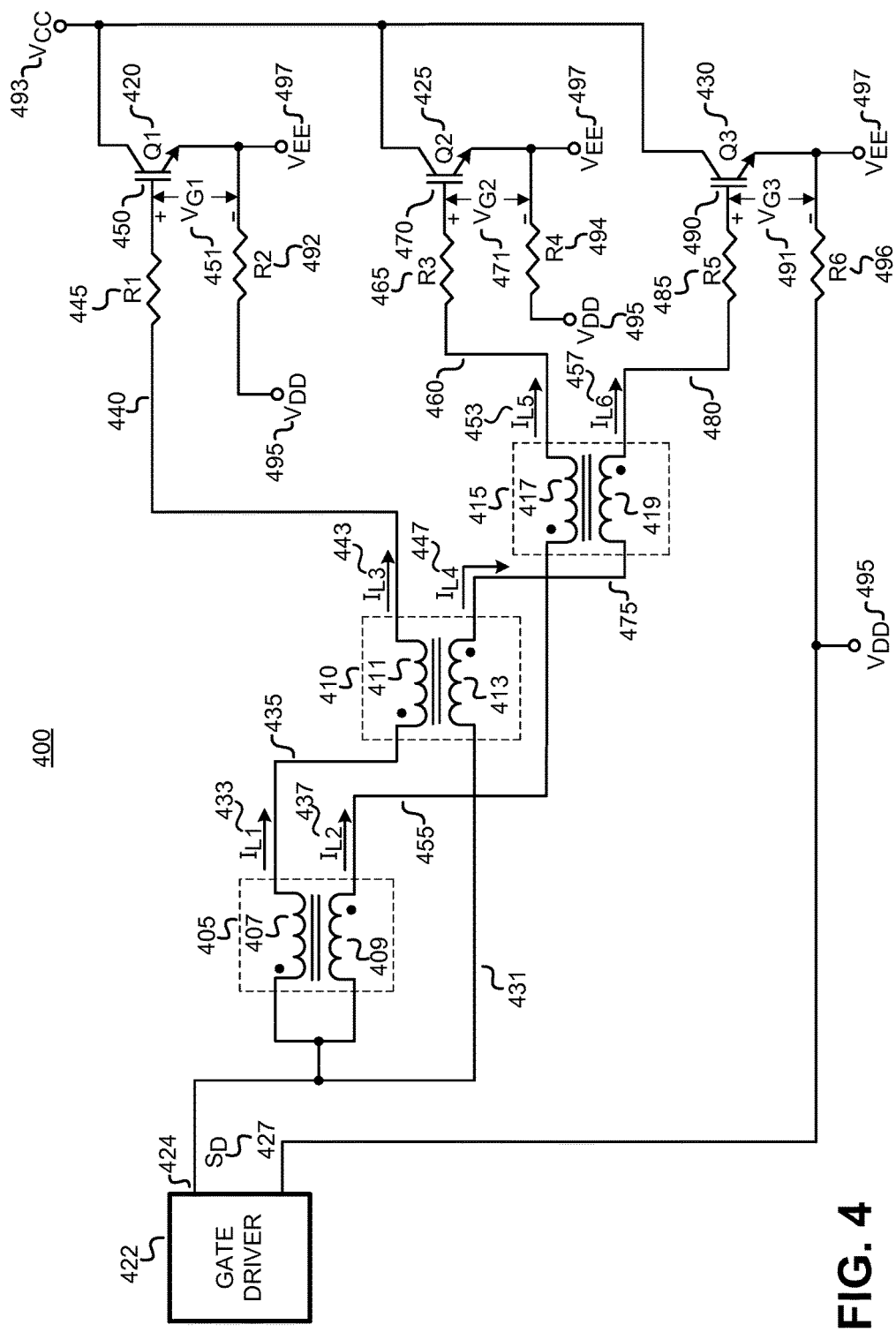
FIG. 4 is a schematic representation of a system that uses a collection of three distribution chokes for paralleling three IGBTs to switch a common collector (drain) current for high power applications, in accordance with an embodiment of the present invention.

FIG. 4 is a schematic representation of a system 400 that uses three distribution chokes 405, 410, 415 along with three voltage-controlled IGBT switches (namely, Q1 420, Q2 425, Q3 430) coupled in parallel to switch a common collector (drain) voltage $V_{CC}$ 493. The collectors of the three IGBTs Q1 420, Q2 425, and Q3 430 are coupled together to the positive supply rail voltage $V_{CC}$ 493. The emitters of the three IGBTs Q1 420, Q2 425, and Q3 430, also referred to as emitter return lines, are coupled together to the negative supply rail voltage $V_{EE}$ 497. System 400 includes a gate driver 422 that outputs a gate drive signal $S_D$ 427 at a gate drive signal output 424. The return line of the gate driver 422 is coupled to a voltage $V_{DD}$ 495. Gate drive signal $S_D$ 427 is coupled by a first conduction path to the gate 450 of power switch 420; by a second conduction path to the gate 470 of power switch 425; and by a third conduction path to the gate 490 of power switch 430. As a result, there are voltages $V_{G1}$ 451, $V_{G2}$ 471, and $V_{G3}$ 491 which are positive, zero or negative with respect to the emitter return voltage $V_{EE}$ 497, at gates 450, 470, 490 of IGBTs Q1 420, Q2 425, and Q3 430 respectively. Gate driver 422 thus drives IGBTs Q1 420, Q2 425, Q3 430 into and out of conduction.

Distribution chokes 405, 410, 415 are illustrated as coupled between the gate driver 422 and power switches Q1 420, Q2 425, Q3 430. In one example, the distribution chokes 405, 410, 415 are shown as coupled inductors. Distribution choke 405 includes a first winding 407 and a second winding 409. Distribution choke 410 includes a first winding 411 and a second winding 413. Distribution choke 415 includes a first winding 417 and a second winding 419. In the example shown, one end of both the first winding 407 and the second winding 409 of the distribution choke 405 are coupled to the gate driver output 424. The other end of the first winding 407 is coupled to one end of the first winding 411 of the distribution choke 410, whereas the other end of the second winding 409 of the distribution choke 405 is coupled to one end of the first winding 417 of the distribution choke 415. One end of the second winding 413 of the choke 410 is coupled to the gate driver output 424. The other end of the first winding 411 of the choke 410 is coupled to the gate of the power switch Q1 420. The other end of the second winding 413 of the distribution choke 410 is coupled to one end of the second winding 419 of the distribution choke 415. The other end of the first winding 417 of the distribution choke 415 is coupled to the gate of the power switch Q2 425. The other end of the second winding 419 of the distribution choke 415 is coupled the gate of the power switch Q3 430. As will be further discussed, the distribution chokes 405, 410, 415 allow for balancing the gate currents $I_{L3}$ 443, $I_{L5}$ 453, $I_{L6}$ 457 of the power switches Q1 420, Q2 425, Q3 430.

The conduction path coupling gate drive signal output 424 to the gate 450 of IGBT Q1 420 includes a winding in each of distribution chokes 405, 410, gate drive signal conductors 435, 440 and gate resistance 445, as well as other conductors. The conduction path coupling gate drive signal output 424 to the gate 470 of IGBT Q2 425 includes a winding in each of distribution chokes 405, 415, gate drive signal conductors 455, 460 and gate resistance 465 to the gate 470 of IGBT Q2 425, as well as other conductors. The conduction path coupling gate drive signal output 424 to the gate 490 of IGBT Q3 430 includes a winding in each of distribution chokes 410, 415, gate drive signal conductors 475, 480 and gate resistance 485 to the gate 490 of IGBT Q3 430, as well as other conductors.

Distribution chokes 405, 410, 415 are each individually configured and coupled to help ensure that respective pairs of exiting currents (i.e., $I_{L1}$ 433 and $I_{L2}$ 437, $I_{L3}$ 443 and $I_{L4}$ 447, or $I_{L5}$ 453 and $I_{L6}$ 457) are nearly identical. In particular, each distribution choke 405, 410, 415 includes a pair of windings on a single core. As shown by the dot markings, the windings are coupled in the conduction paths in a differential mode, i.e., to present relatively low impedance to currents that are equal but a relatively high impedance to the differences between those currents. Thus all gate currents $I_{L1}$ 433, $I_{L2}$ 437, $I_{L3}$ 443, $I_{L4}$ 447, $I_{L5}$ 453, and $I_{L6}$ 457 are substantially identical.

In addition to this individual configuration, distribution chokes 405, 410, and 415 are coupled to one another to ensure that the currents $I_{L1}$ 433, $I_{L2}$ 437, $I_{L3}$ 443, $I_{L4}$ 447, $I_{L5}$ 453, and $I_{L6}$ 457 are nearly equal. In particular, current $I_{L1}$ 433, from the distribution choke 405, is coupled by gate drive signal conductor 435 to distribution choke 410. In turn, currents $I_{L3}$ 443, $I_{L4}$ 447 from the distribution choke 410 are nearly identical. Current $I_{L3}$ 443 is coupled by gate drive signal conductor 440 and gate resistance 445 to the gate 450 of IGBT Q1 420. Also, current $I_{L2}$ 437, which exits the distribution choke 405 is nearly identical to current $I_{L1}$ 433, and coupled by gate drive signal conductor 455 to distribution choke 415. Current $I_{L4}$ 447 from the distribution choke 410, which is nearly identical to current $I_{L3}$ 443, is coupled by gate drive signal conductor 475 to distribution choke 415. In turn, currents $I_{L5}$ 453 and $I_{L6}$ 457 from the distribution choke 415 are nearly identical. Current $I_{L5}$ 453 is coupled by gate drive signal conductor 460 and gate resistance 465 to the gate 470 of power switch 425. Current $I_{L6}$ 457 is coupled by gate drive signal conductor 480 and gate resistance 485 to the gate 490 of IGBT Q3 430. As a result, the currents $I_{L3}$ 443, $I_{L5}$ 453, $I_{L6}$ 457 that are coupled into drive signal conductors 440, 460, 480 respectively, are nearly identical. By ensuring that currents $I_{L3}$ 443, $I_{L5}$ 453, $I_{L6}$ 457 are nearly equal, the benefits of the distribution choke can be achieved even when more than two voltage-controlled power switches are paralleled.

In a real world implementation of system 400, distribution chokes 405, 410, 415 are generally disposed due to mechanical reasons in close proximity of gate drive signal output 424. In particular, the gate drive signal output 424 is coupled to a conductor 431 that conducts the current directed to all of IGBTs Q1 420, Q2 425, Q3 430 to chokes 405, 410, 415 respectively. The choke 405 is coupled to choke 410 by a conductor 435 and choke 405 is coupled to choke 415 by conductor 455. Conductors 431, 435, and 455 are typically not equal in length due to mechanical reasons, which results in these conductors providing different impedances. Currents $I_{L3}$ 443, $I_{L5}$ 453, $I_{L6}$ 457 from distribution chokes 405, 410, 415 respectively are nearly identical and may travel along relatively longer conductors 440, 460, 480 and through respective gate resistances 445, 465, 485 to bias the gates 450, 470, 490 of IGBTs Q1 420, Q2 425, and Q3 430 respectively. The resulting different impedances (due the different lengths of conductors and parasitic inductances and capacitance of those conductors and other mentioned devices in the conduction path) of the different resulting paths from the gate driver output 424 to the respective gate 450, 470, 490 are nearly compensated by the distribution chokes 405, 410, 415.

Most of the parasitic and other interactions that could potentially give rise to differences between the voltages $V_{G1}$ 451, $V_{G2}$ 471, $V_{G3}$ 491 applied to gates 450, 470, 490 of IGBTs Q1 420, Q2 425, Q3 430 respectively are found between the respective of distribution chokes 405, 410, 415 and gates 450, 470, 490. For example, the difference between the lengths of conductors 440, 460, 480 is typically greater between distribution chokes 405, 410, 415 and gates 450, 470, 490 than between gate drive signal output 424 and distribution chokes 405, 410, 415. In another example, any difference in the resistances of gate resistances 445, 465, 485 is found between distribution chokes 405, 410, 415 and gates 450, 470, 490 rather than between gate drive signal output 424 and distribution chokes 405, 410, 415. By ensuring that currents $I_{L3}$ 443, $I_{L5}$ 453, $I_{L6}$ 457 are nearly identical, distribution chokes 405, 410, 415 minimize the impact of such differences during the switching of IGBTs Q1 420, Q2 425, and Q3 430 respectively.

As explained earlier with respect to FIG. 2A, the gate resistors 445, 465, 485 may also be replaced by a single resistor having one third of the value of resistor 445 (as resistors 445, 465 and 485 having per default the same value). This single resistor may be placed alternatively in the portion of the conduction path that includes conductor 431 between gate driver 422 and any of chokes 405, 410, 415.

Gate driver 422 is a common driver that outputs a single gate drive signal to drive the gates of multiple power switches. In general, this single gate drive signal will turn off and turn on the power switches with asymmetric pulses and both "push-up" and "pull-down" the gate voltages. In general, gate driver 422 includes one or more timing inputs (not shown) for receiving timing control inputs or signal(s) characterizing the times at which the power switches are to be switched. Generally, those signals modulate the duration of current conduction by the power switches within a series of periods (i.e., pulse width modulation). The output gate drive signal is suitable for switching IGBTs Q1 420, Q2 425, and Q3 430. For example, the gate currents at IGBTs Q1 420, Q2 425, and Q3 430 must be sufficiently large to move carriers into and out of the gate region at a desired switching speed. Common drivers for switching IGBTs generally output gate drive signals of voltages between +/−15 Volts between gate and emitter. In real-world applications, the gate drive signal voltages may also have other positive and negative values such as +15 Volts/−10 Volts, +20 Volts/0 Volt, and +18 Volts/−6 Volts.

In some examples, gate resistances 445, 465, 485 have a resistance dimensioned to reduce or prevent, e.g., di/dt induced voltage spiking, oscillations, and the like. For example, gate resistances 445, 465, 485 are generally in the range of 0.1 to several Ohms. In general, gate resistances 445, 465, 485 are matched with very tight tolerances.

In the illustrated example, the emitter return lines are coupled to voltage $V_{DD}$ 495. In another embodiment of system 400, the return lines may be coupled to ground. Further, resistances R2 492, R4 494, R6 496 are coupled between the emitters of the power switches Q1 420, Q2 425, Q3 430 respectively and the gate driver return line. Resistances R2 492, R4 494, R6 496, also referred to as return line resistances, have a resistance selected to suppress currents from flowing between the respective emitters (sources) of power switches Q1 420, Q2 425, Q3 430. Differences in the emitter return lines, hence, differences in the emitter return line impedances are also compensated by the distribution chokes 405, 410, 415. In general, emitter return line resistances 492, 494, 496 are matched with very tight tolerances.

Figure 5:
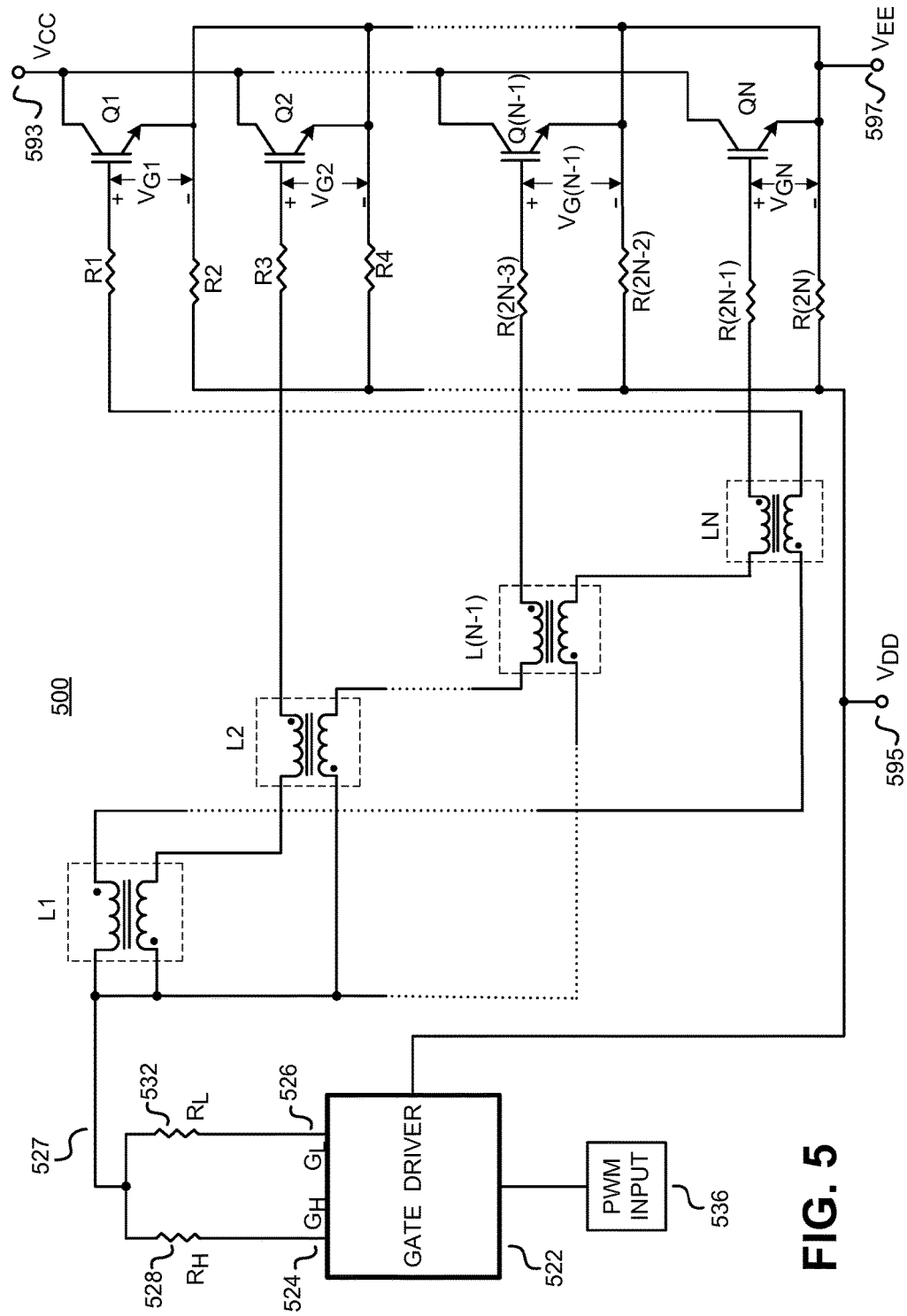
FIG. 5 is a schematic representation of a system that uses an arbitrary number of distribution chokes for paralleling voltage-controlled IGBTs to switch a common collector (drain) current for high power applications, in accordance with an embodiment of the present invention.

FIG. 5 is a schematic representation of a system 500 that uses an arbitrary number 'N' distribution chokes for paralleling 'N' voltage-controlled IGBTs to switch a common collector (drain) voltage $V_{CC}$ 593. FIG. 5 represents a discrete gate resistance embodiment in accordance with teachings of the present invention. As illustrated the collectors of all the IGBTs are coupled together to a positive supply rail voltage $V_{CC}$ 593. The emitters of all the IGBTs, also referred to as emitter return lines, are coupled together to a negative supply rail voltage $V_{EE}$ 597. System 500 includes an asymmetric gate driver 522 that outputs a gate high signal $G_H$ at a gate high signal output 524 and a gate low signal $G_L$ at a gate low signal output 526. The return line of the gate driver 522 is coupled to voltage $V_{DD}$ 595. The gate high signal $G_H$ has a magnitude substantially sufficient to "push-up" the gate voltages and to drive the power switches into an on-state. Gate low signal $G_L$ has a magnitude sufficient to "pull-down" the gate voltages and drive the power switches into an off-state. Gate high signal $G_H$ is coupled to a conductor 527 by a first resistance $R_H$ 528. Gate low signal $G_L$ is coupled to conductor 527 by a second resistance $R_L$ 532. Conductor 527 is in turn coupled by multiple distribution chokes, gate drive signal conductors, and gate resistances to the gates of respective power switches. As a result, there are voltages $V_{G1}, V_{G2}, \ldots, V_{G(N-1)}, V_{GN}$ at gates of the IGBTs Q1, Q2, ... Q(N−1), QN. Gate driver 522 thus controls multiple IGBTs into and out of conduction.

Distribution chokes L1, L2, . . . , L(N−1), LN are illustrated as coupled between the gate driver 522 and IGBTs Q1, Q2, . . . , Q(N−1), QN. In one example, each of the distribution chokes L1, L2, . . . , L(N−1), LN is shown as a coupled inductor with a first winding and a second winding. Further, each winding is shown to have a first end and a second end. In the example shown, the first ends of both the first and the second windings of the choke L1 are coupled to the gate driver output 527. The second end of the first winding is coupled to the first end of the second winding of the last choke LN. The second end of the second winding of the choke L1 is coupled to the first end of the first winding of the second choke L2. For all the intermediate chokes L2 through L(N−1), the first end of the first winding is coupled to the second end of the second winding of the previous choke; the second end of the first winding is coupled to the gate of the corresponding power switch; the first end of the second winding is coupled to the gate driver output 527, and the second end of the second winding is coupled to the first end of the first winding of the next choke. Now referring to the last choke LN, the first end of the first winding is coupled to the second end of the winding L(N−1); the second end of the first winding is coupled to the gate of the power switch QN; the first end of the second winding is coupled to the second end of the first winding of choke L1; and the second end of the second winding is coupled to the gate to the IGBT Q1. The coupling of distribution chokes as such may be referred to as an interwoven coupling for the purpose of this specification.

Each of the N distribution chokes is individually configured to ensure that the respective currents from them are nearly identical. As a result of the interwoven coupling mentioned above, the currents that are coupled into the drive signal conductors are nearly identical and the benefits of a distribution choke can be achieved even when N voltage-controlled power switches are paralleled.

In one example, system 500 includes a PWM input unit 536 that provides a pulse width modulation signal to gate driver 522. The pulse width modulation signal characterizes the times at which the IGBTs are to be switched.

Figure 6:
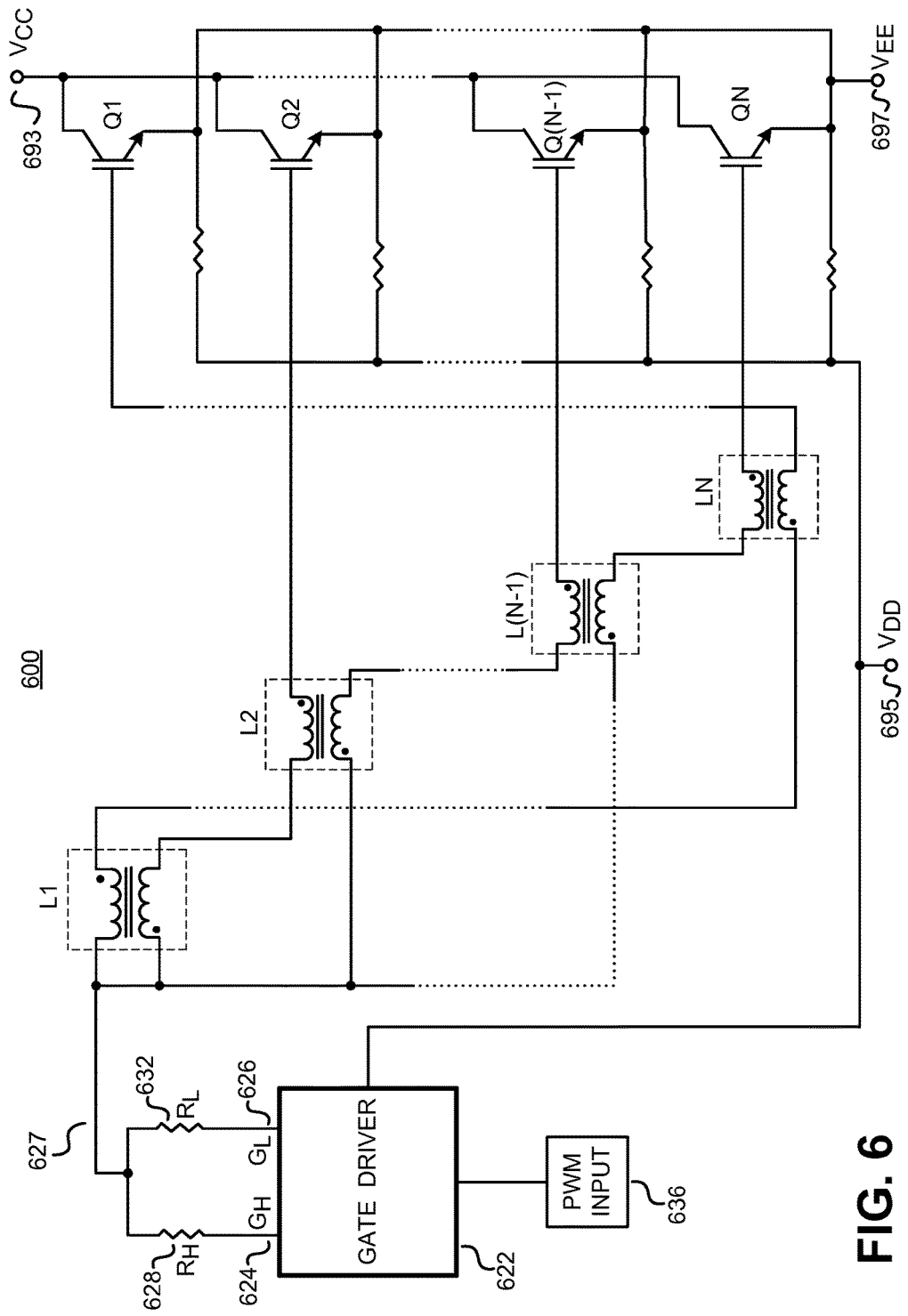
FIG. 6 is a schematic representation of another system that uses an arbitrary number of distribution chokes for paralleling voltage-controlled power switches to switch a common collector (drain) current for high power applications, in accordance with an embodiment of the present invention.

FIG. 6 is a schematic representation of another system 600 that uses an arbitrary number 'N' distribution chokes for paralleling 'N' voltage-controlled IGBTs to switch a common collector (drain) voltage $V_{CC}$ 693. As illustrated the collectors of all the IGBTs are coupled together to the positive supply rail voltage $V_{CC}$ 693. The emitters of all the IGBTs, also referred to as emitter return lines are coupled together to a negative supply rail voltage $V_{EE}$ 697. The return line of the gate driver 622 is coupled to voltage $V_{DD}$ 695.

Distribution chokes L1, L2, . . . , L(N-1), LN are illustrated as coupled between the gate driver 622 and IGBTs Q1, Q2, . . . , Q(N-1), QN. In one example, each of the distribution chokes L1, L2, . . . , L(N-1), LN is shown as a coupled inductor with a first winding and a second winding. Further, each winding is shown to have a first end and a second end. The gate driver 622, distribution chokes L1, L2, . . . , L(N-1), LN, and IGBTs Q1, Q2, . . . , Q(N-1), QN are interwovenly coupled as explained with respect to FIG. 5.

FIG. 6 represents a common gate resistance embodiment in accordance with teachings of the present invention. In contrast with the system 500, the system 600 does not include a collection of gate resistances each coupled to a respective gate of a power switch. Rather, system 600 includes a first resistance $R_H$ 628 and a second resistance $R_L$ 632 dimensioned to provide the desired gate currents for each coupled power switch $Q_1, Q_2, \ldots, Q_{(N-1)}$, and $Q_N$. In another example, the first resistance $R_H$ 628 and the second resistance $R_L$ 632 may be dimensioned to reduce or prevent, e.g., di/dt induced voltage spiking, oscillations, and the like. For example, resistances $R_H$ 628, $R_L$ 632 are generally in the range of 0.1 to several Ohms.

As explained earlier, in a typical configuration of paralleled power switches, there may be significant load current imbalances. Due to the distribution mode chokes, the substantial portions of load currents circulating between the gate driver, output stage, and the gates of the power switches may be balanced. Some other common solutions to optimize the load current imbalances may also include mechanical optimization of DC-link and AC-link structures, and placing resistors in emitter paths of IGBTs.

In one aspect of this invention, capacitances may be coupled to the gate drive circuitry to balance gate voltages of the IGBTs during switching transients. The capacitances may be used with or without the distribution mode chokes. In one example, the capacitances may be coupled to the gates of the IGBTs. Capacitances coupled in this way may be referred to as gate capacitors for the purpose of this specification. Additionally, using gate capacitors in a configuration of paralleled IGBTs as explained above may be referred to as capacitive clamping, for the purpose of this specification. In operation, if transient gate voltages of the individual gates of the paralleled IGBTs are not equal, then there may be a displacement current through the gate capacitors until a condition of equilibrium is reached. The use of gate capacitors may also reduce circulating currents resulting from the effect of Miller-capacitances. In general, in a configuration of paralleled power switches driven by a common gate driver and distribution mode chokes, the addition gate capacitors may substantially allow balancing of the actual gate voltages more effectively. In general, in paralleled power switch configurations where both distribution mode chokes and gate capacitors are used, the distribution mode chokes may substantially balance the gate currents from the gate driver; whereas the gate capacitors may substantially balance the gate voltages of the IGBTs. As such, the overall load current balance of the power module may be improved. Addition of gate capacitors is advantageous especially when several power switches are coupled in parallel as illustrated in FIG. 5 or FIG. 6.

The addition of gate capacitors may help avoid the circulating currents resulting from the close magnetic couplings of the power semiconductors or power semiconductor modules and Miller capacitances. In yet another aspect of this invention, resistors may also be coupled in parallel to the capacitive clamps. The resistors may allow current to flow in case the gate voltages are not equal. Additionally, the resistors may also help remove any static imbalances in the circuits.

Figure 7:
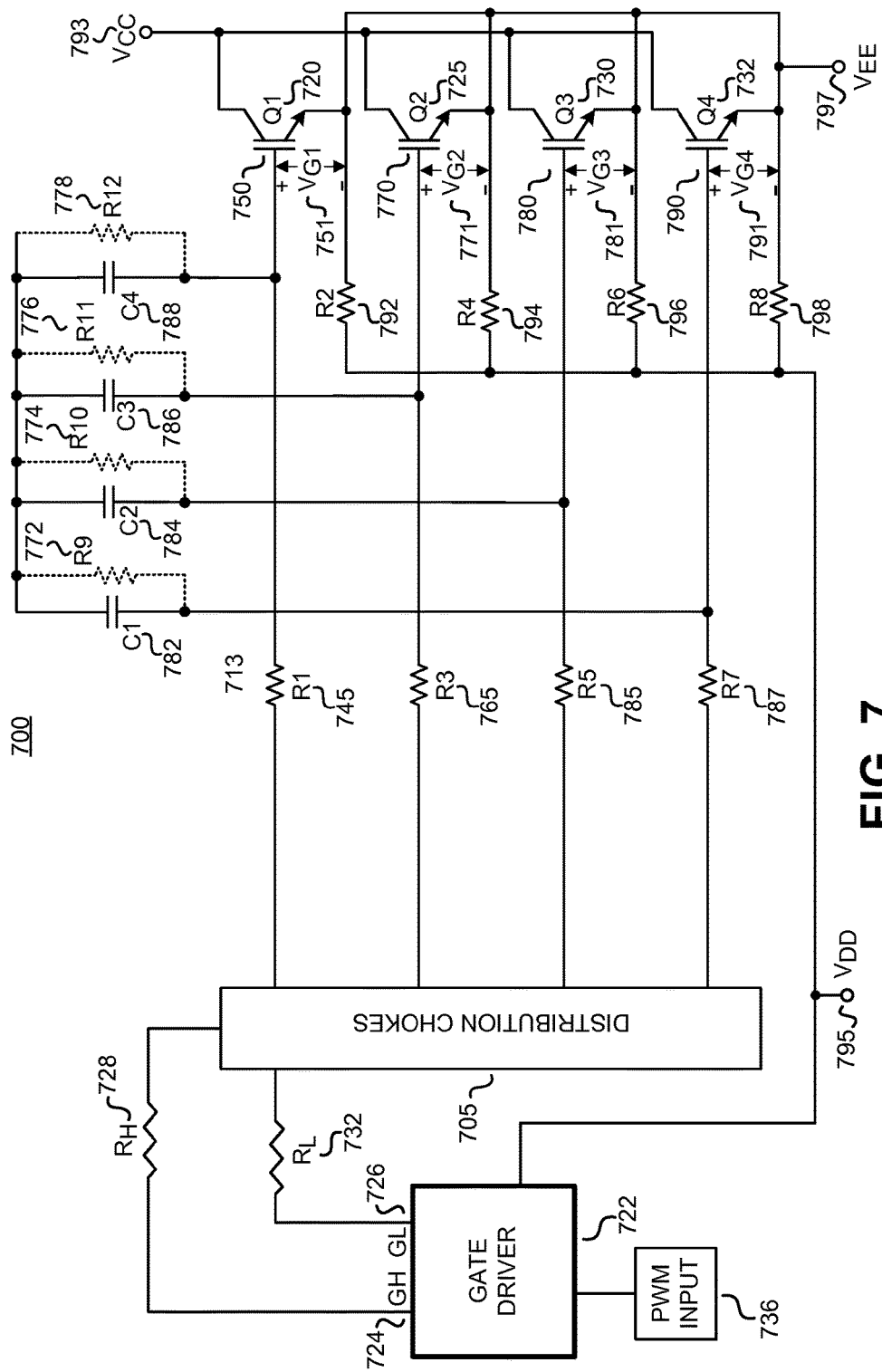
FIG. 7 is a schematic representation of another system that uses an arbitrary number of distribution chokes and capacitive clamps for paralleling voltage-controlled power switches to switch a common collector (drain) current for high power applications, in accordance with an embodiment of the present invention.

FIG. 7 is a schematic representation of a system 700 that uses capacitors or capacitive clamps in addition to distribution chokes for paralleling 'N' voltage-controlled IGBTs to switch a common collector (drain) voltage $V_{CC}$ 793. FIG. 7 represents a discrete gate resistance embodiment in accordance with teachings of the present invention.

FIG. 7 includes a PWM input unit 736, a gate driver 722, a distribution chokes matrix 705, a first resistance $R_H$ 728, a second resistance $R_L$ 732, IGBTs Q1 720, Q2 725, Q3 730, and Q4 732, gate resistors R1 745, R3 765, R5 785, and R7 787, emitter resistors R2 792, R4 794, R6 796, and R8 798, gate capacitors C1 782, C2 784, C3 786, C4 788, optional resistors R9 772, R10 774, R11 776, and R12 778.

As illustrated the collectors of all the IGBTs Q1 720, Q2 725, Q3 730, Q4 732 are coupled together to a positive supply rail voltage $V_{CC}$ 793. The emitters of all the IGBTs Q1 720, Q2 725, Q3 730, Q4 732, also referred to as emitter return lines, are coupled together to a negative supply rail voltage $V_{EE}$ 797. The gate driver 722 that outputs a gate high signal $G_H$ at a gate high signal output 724 and a gate low signal $G_L$ at a gate low signal output 726. The return line of the gate driver 722 is coupled to voltage $V_{DD}$ 795.

The distribution choke matrix 705 includes a number of distribution chokes. The PWM input unit 736, gate drive 722, are coupled to drive the IGBTs Q1 720, Q2 725, Q3 730, Q4 732 via the distribution choke matrix as illustrated in FIG. 5. The gate capacitors C1 782, C2 784, C3 786, C4 788 are coupled between the gate resistors and the gates of 750, 770, 780, 790 of the IGBTs. In particular, first ends of the gate resistors R1 745, R3 765, R5 785, R7 787 are coupled to the distribution choke matrix, whereas, their second ends are coupled to the gates 750, 770, 780, 790 and first ends of the gate capacitors C1 782, C2 784, C3 786, C4 788. Second ends of the gate capacitors C1 782, C2 784, C3 786, C4 788 are coupled together.

As mentioned earlier in the specification, the gate capacitors C1 782, C2 784, C3 786, C4 788 substantially balance the gate voltages $V_{G1}$ 751, $V_{G2}$ 771, $V_{G3}$ 781, $V_{G4}$ 791. The optional resistors R9 772, R10 774, R11 776, R12 778 may also allow current flow in case the gate voltages are not equal and may also help reduce static imbalances.

Figure 8A:
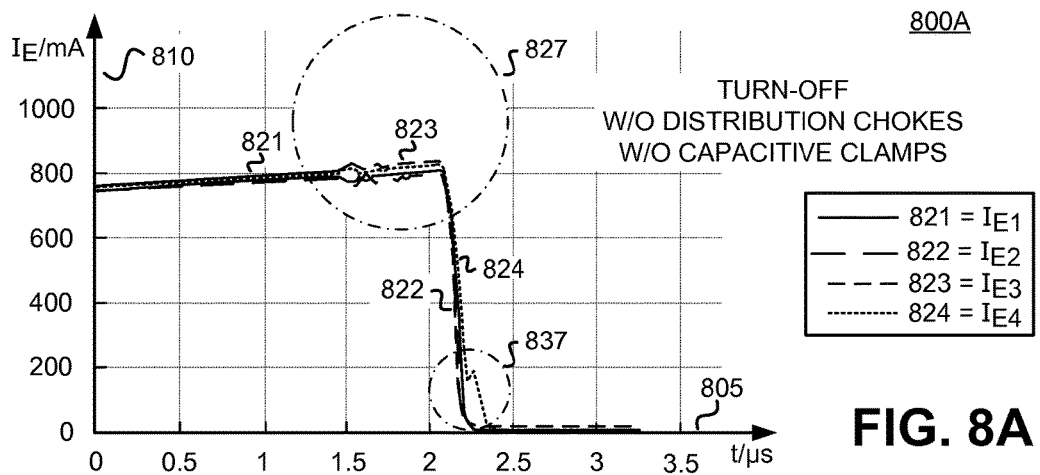
FIGS. 8A, 8B, 8C, 9A, 9B, 9C are scope captures. 800A, 800B, 800C, 900A, 900B, 900C compare the switching of four paralleled IGBTs by a common gate driver without a distribution choke or capacitive clamps (scope captures 800A, 900A), with a distribution choke and without capacitive clamps (scope captures 800B, 900B), and with a distribution choke and capacitive clamps (scope captures 800C, 900C).
Figure 8B:
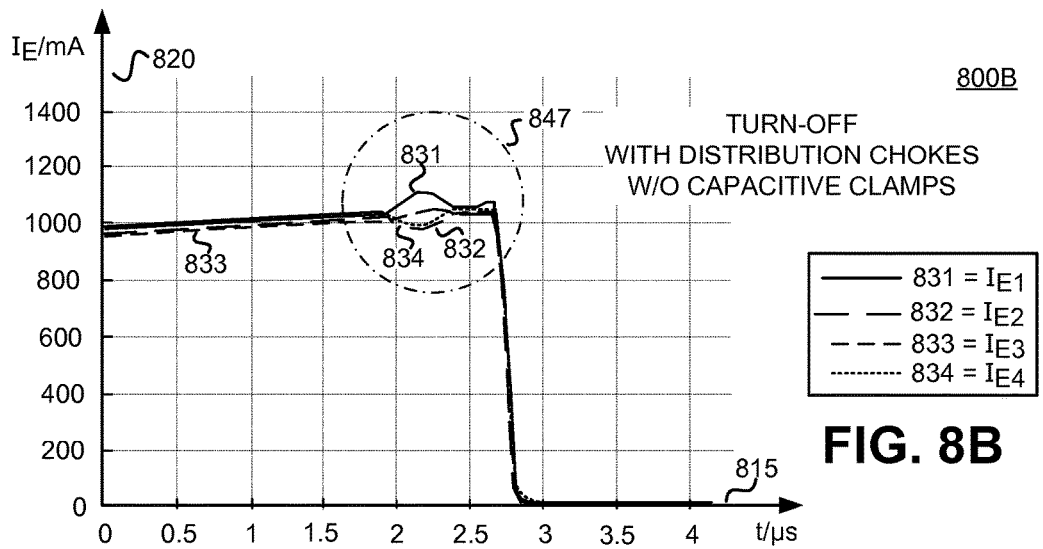
Figure 8C:
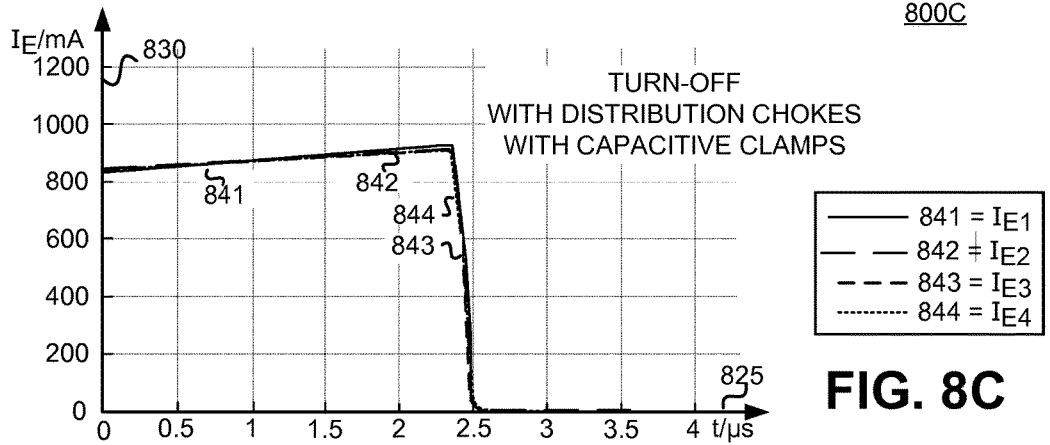
Figure 9A:
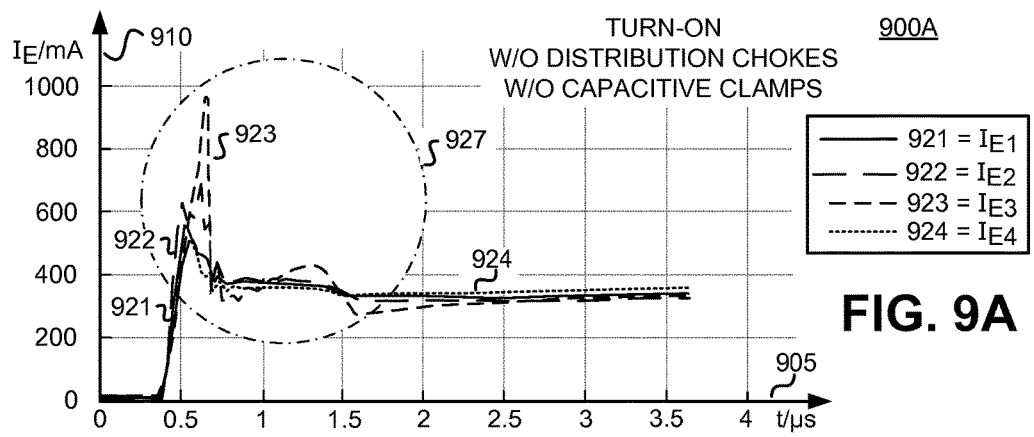
Figure 9B:
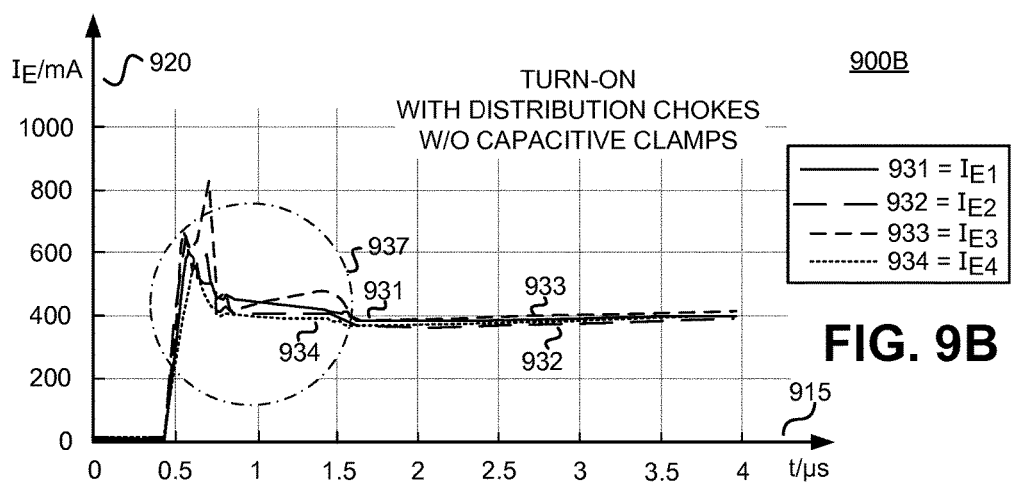
Figure 9C:
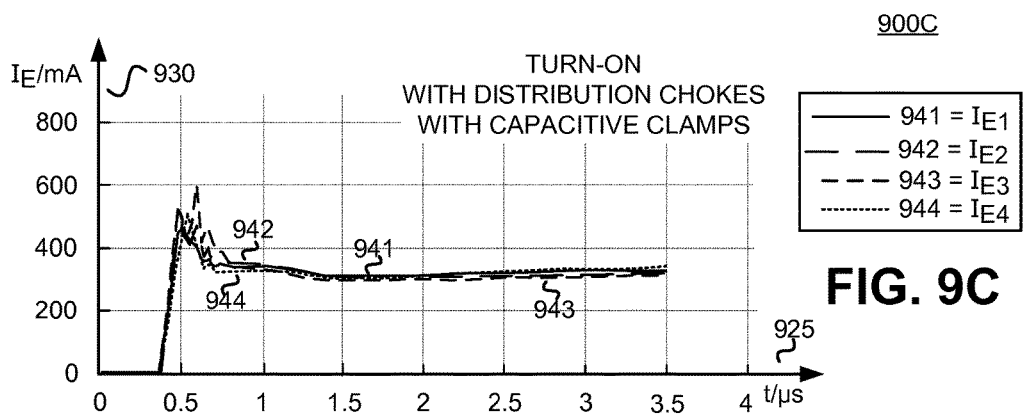

FIGS. 8A, 9A are scope captures 800A, 900A respectively which illustrate the switching of four paralleled IGBTs by a common gate driver without distribution chokes or capacitive clamps. FIGS. 8B, 9B are scope captures 800B, 900B respectively which illustrate the switching of four paralleled IGBTs by a common gate driver with distribution chokes and without capacitive clamps. FIGS. 8C, 9C are scope captures 800C, 900C respectively which illustrate the switching of four paralleled IGBTs by a common gate driver with distribution chokes and with capacitive clamps.

Scope captures 800A, 900A include an x-axis 805 and y-axis 810, x-axis 905 and y-axis 910 respectively. Position along x-axes 8005, 905 indicates time. Position along y-axes 810, 910 indicates the magnitude of current. Although the time scale along x-axes 805, 905 is identical for all of the illustrated traces, the scale of the current along y-axes 810, 910 may vary for the different traces.

Scope captures 800B, 900B include an x-axis 815 and y-axis 820, x-axis 915 and y-axis 920 respectively. Position along x-axes 815, 915 indicates time. Position along y-axes 820, 920 indicates the magnitude of current. Although the time scale along x-axes 815, 915 is identical for all of the illustrated traces, the scale of the current along y-axes 820, 920 may vary for the different traces.

Scope captures 800C, 900C include an x-axis 825 and y-axis 830, x-axis 925 and y-axis 930 respectively. Position along x-axes 825, 925 indicates time. Position along y-axes 830, 930 indicates the magnitude of current. Although the time scale along x-axes 825, 925 is identical for all of the illustrated traces, the scale of the current along y-axes 830, 930 may vary for the different traces.

Scope capture 800A trace includes traces 821, 822, 823, 824. Traces 821, 822, 823, 824 represent the emitter currents $I_{E1}$, $I_{E2}$, $I_{E3}$, $I_{E4}$ of the IGBTs during switching from an on-state to an off-state. Scope capture 800B trace includes traces 831, 832, 833, 834. Traces 831, 832, 833, 834 represent the emitter currents $I_{E1}$, $I_{E2}$, $I_{E3}$, $I_{E4}$ of the IGBTs during switching from an on-state to an off-state. Scope capture 800C trace includes traces 841, 842, 843, 844. Traces 841, 842, 843, 844 represent the emitter currents $I_{E1}$, $I_{E2}$, $I_{E3}$, $I_{E4}$ of the IGBTs during switching from an on-state to an off-state.

As can be seen in the scope capture 800A, in the area marked by the circles 827 and 837, the emitter currents are substantially unequal. Referring to scope capture 800B, in the area marked by the circle 847, the differences in the values of emitter currents are reduced with respect to the area encompassed by circle 837, but increased with respect to the area encompassed by circle 827. The increase in the area encompassed by circle 827 results from current injection through the Miller-capacitance of the power switches. These example traces thus illustrate the effectiveness of capacitive clamping in a way that other examples may not. Referring to the scope capture 800C, the emitter currents are substantially equal throughout the turn-off transition with both distribution chokes and capacitive clamps.

Scope capture 900A trace includes traces 921, 922, 923, 924. Traces 921, 922, 923, 924 represent the emitter currents $I_{E1}$, $I_{E2}$, $I_{E3}$, $I_{E4}$ of the IGBTs during switching from an off-state to an on-state (also referred to as turn-on transition). Scope capture 900B trace includes traces 931, 932, 933, 934. Traces 931, 932, 933, 934 represent the emitter currents $I_{E1}$, $I_{E2}$, $I_{E3}$, $I_{E4}$ of the IGBTs during switching from an off-state to an on-state. Scope capture 900C trace includes traces 941, 942, 943, 944. Traces 941, 942, 943, 944 represent the emitter currents $I_{E1}$, $I_{E2}$, $I_{E3}$, $I_{E4}$ of the IGBTs during switching from an off-state to an on-state.

As can be seen from the scope capture 900A, in the area marked by the circle 927, the emitter currents are substantially unequal. Referring to scope capture 900B, as indicated in the area by the circle 937, the differences in the emitter currents are substantially reduced compared to the similar portions of scope capture 900A. Referring to the scope capture 900C, the emitter currents are substantially equal throughout the turn-on transition.

The above mentioned observations further illustrate the advantages of driving paralleled IGBTs with distribution chokes and with or without capacitive clamps.

A number of implementations have been described. Nevertheless, other implementations are within the scope of the following claims. The above description of illustrated examples of the present invention, including what is described in the abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

What is claimed:

1. A power module, comprising:
a first power switch having a first gate;
a second power switch paralleled with the first power switch and having a second gate;
a third power switch paralleled with the first and the second power switches and having a third gate;
a terminal coupled to receive a gate drive signal from a gate driver;
a first conduction path to couple the gate drive signal to the first gate;
a second conduction path to couple the gate drive signal to the second gate;
a third conduction path to couple the gate drive signal to the third gate;
a distribution choke to distribute the gate drive signal to the first and second power switches, the distribution choke having a first winding disposed in the first conduction path and a second winding disposed in the second conduction path, the distribution choke coupled in a differential mode;
a second distribution choke to distribute the gate drive signal, the second distribution choke comprising a third winding disposed in the first conduction path and a fourth winding disposed in the third conduction path; and
a third distribution choke to distribute the gate drive signal, the third distribution choke comprising a fifth winding disposed in the second conduction path.

2. The power module of claim 1, wherein the third distribution choke comprises a sixth winding disposed in the third conduction path.

3. The power module claim 1, wherein all parts are integrated in one power module.

4. The power module of claim 1, wherein the first and second power switches are IGBTs.

5. The power module of claim 1, wherein the first and second power switches are MOSFETs.

6. The power module of claim 1, wherein the first and second power switches are HEMTs.

7. The power module of claim 1, wherein:
the first conduction path comprises a first gate resistance; and
the second conduction path comprises a second gate resistance.

8. The power module of claim 1, wherein:
the first conduction path and the second conduction path comprise a common gate resistance.

9. The power module of claim 1, wherein:
the gate driver is a common gate driver including a common power switch driver, the gate driver including one or more gate signal outputs or with separated Hi/Lo gate outputs.

10. A power module, comprising:
a first power switch having a first gate;
a second power switch paralleled with the first power switch and having a second gate;
a first conduction path to couple a gate drive signal to the first gate;

a second conduction path to couple the gate drive signal to the second gate; and a distribution choke to distribute the gate drive signal to the first and second power switches, the distribution choke having a first winding disposed in the first conduction path and a second winding disposed in the second conduction path, the distribution choke coupled in a differential mode, wherein the power module comprises an equal number of paralleled power switches and chokes, and wherein each of the conduction paths includes at least two windings.

11. A device comprising:

a first IGBT having a first gate;

a second IGBT coupled in parallel with the first IGBT and having a second gate;

a third IGBT coupled in parallel with the first and the second IGBTs and having a third gate;

an IGBT driver to output a gate drive signal;

a first conduction path to couple the gate drive signal to the first gate;

a second conduction path to couple the gate drive signal to the second gate;

a third conduction path to couple the gate drive signal to the third gate;

a distribution choke to distribute the gate drive signal to the first and second IGBTs, the distribution choke having a first winding disposed in the first conduction path and a second winding disposed in the second conduction path, the distribution choke coupled in a differential mode;

a second distribution choke to distribute the gate drive signal, the second distribution choke comprising a third winding disposed in the first conduction path and a fourth winding disposed in the third conduction path; and a third distribution choke to distribute the gate drive signal, the third distribution choke comprising a fifth winding disposed in the second conduction path.

12. The device of claim 11, wherein the third distribution choke comprises a sixth winding disposed in the third conduction path.

13. The device of claim 11, wherein:

the first conduction path comprises a first gate resistance; and the second conduction path comprises a second gate resistance.

14. The device of claim 11, wherein:

the first conduction path and the second conduction path comprise one or more first conductors between the IGBT driver and the distribution choke;

the first conduction path comprises one or more second conductors between the distribution choke and the first gate;

the second conduction path comprises one or more third conductors between the distribution choke and the second gate;

the one or more second conductors are longer than the one or more first conductors; and the one or more third conductors are longer than the one or more first conductors.

15. A power module comprising:

a plurality of power switches comprising a first power switch, a second power switch, and a third power switch;

a plurality of parallel conduction paths comprising:

a first conduction path to a gate of the first power switch;

a second conduction path to a gate of the second power switch; and a third conduction path to a gate of the third power switch;

a plurality of distribution chokes comprising:

a first distribution choke comprising a first winding disposed in the first conduction path and a second winding disposed in the second conduction path;

a second distribution choke comprising a third winding disposed in the second conduction path and a fourth winding disposed in the third conduction path; and a third distribution choke comprising a fifth winding disposed in the third conduction path and a sixth winding disposed in the first conduction path.

16. The power module of claim 15, wherein:

the first conduction path is coupled from a gate driver output to the gate of the first power switch;

the second conduction path is coupled from the gate driver output to the gate of the second power switch; and the third conduction path is coupled from the gate driver output to the gate of the third power switch.

17. The power module of claim 15, wherein each of the plurality of power switches comprises an IGBT.

18. The power module of claim 15, wherein each of the plurality of power switches comprises a MOSFET.

19. The power module of claim 15, wherein each of the plurality of power switches comprises a HEMT.

20. The power module of claim 15, wherein each of the plurality of conduction paths comprises at least one discrete capacitor.

21. The power module of claim 15, wherein at least one of the plurality of power switches comprises an IGBT.

22. The power module of claim 15, wherein at least one of the plurality of power switches comprises a MOSFET.

23. The power module of claim 15, wherein at least one of the plurality of power switches comprises a HEMT.

* * * * *